US012740037B2

(12) United States Patent
Wang et al.

(10) Patent No.: US 12,740,037 B2
(45) Date of Patent: Sep. 15, 2026

(54) MEMORY DEVICE AND METHOD FOR MANUFACTURING THE SAME

(71) Applicant: Taiwan Semiconductor Manufacturing Company, Ltd., Hsinchu (TW)

(72) Inventors: Ping-Wei Wang, Hsin-Chu (TW); Jui-Wen Chang, Hsinchu (TW); Feng-Ming Chang, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 826 days.

(21) Appl. No.: 17/743,645

(22) Filed: May 13, 2022

(65) Prior Publication Data

US 2023/0371228 A1 Nov. 16, 2023

(51) Int. Cl.

| | |
|---|---|
| ***H01L 27/11*** | (2006.01) |
| ***H01L 29/06*** | (2006.01) |
| ***H01L 29/423*** | (2006.01) |
| ***H10B 10/00*** | (2023.01) |
| ***H10D 30/01*** | (2025.01) |
| ***H10D 30/67*** | (2025.01) |

(Continued)

(52) U.S. Cl.

CPC ......... *H10B 10/125* (2023.02); *H10D 30/031* (2025.01); *H10D 30/6735* (2025.01); *H10D 30/6757* (2025.01); *H10D 62/118* (2025.01); *H10D 64/017* (2025.01)

(58) Field of Classification Search

CPC ............. H10D 30/031; H10D 30/6735; H10D 30/6757; H10D 30/797; H10D 30/014; H10D 62/118; H10D 62/121; H10D 62/822; H10D 64/017; H10B 10/125; H10B 10/00–18; B82Y 10/00; G11C 11/41–419; G11C 5/06–10

See application file for complete search history.

(56) References Cited

U.S. PATENT DOCUMENTS 9,209,247 B2 12/2015 Colinge et al.
9,236,267 B2 1/2016 De et al.

(Continued)

FOREIGN PATENT DOCUMENTS

CN 110571195 A * 12/2019 .......... H01L 27/1104

OTHER PUBLICATIONS

Wang translation (Year: 2019).*

*Primary Examiner* — Steven B Gauthier
*Assistant Examiner* — Rhys Poniente Sheker
(74) *Attorney, Agent, or Firm* — McClure, Qualey & Rodack, LLP

(57) ABSTRACT

A memory device includes a first pull-down (PD) transistor, a second PD transistor, a first pass-gate (PG) transistor, and a second PG transistor arranged in a first direction and share a first active area, and a first pull-up (PU) transistor, a second PU transistor, a first dielectric structure, and a second dielectric structure arranged in the first direction and share a second active area. The first dielectric structure and a third gate structure of the first PG transistor extend in the second direction and are aligned with each other in the second direction. The second dielectric structure and a fourth gate structure of the second PG transistor extend in the second direction and are aligned with each other in the second direction.

20 Claims, 32 Drawing Sheets

(51) Int. Cl.
*H10D 62/10* (2025.01)
*H10D 64/01* (2025.01)

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2010/0237419 | A1* | 9/2010 | Yang | H10B 10/12 257/E27.098 |
| 2015/0243667 | A1* | 8/2015 | Liaw | H10B 10/12 716/110 |
| 2017/0018302 | A1* | 1/2017 | Yin | H01L 23/528 |
| 2018/0219015 | A1* | 8/2018 | Nelson | G11C 11/419 |
| 2020/0006354 | A1* | 1/2020 | Wen | H10B 10/12 |
| 2021/0066319 | A1* | 3/2021 | Chang | H10B 20/25 |
| 2021/0202498 | A1* | 7/2021 | Liaw | H01L 21/02603 |
| 2022/0108983 | A1* | 4/2022 | Bao | H10D 30/751 |

* cited by examiner

MEMORY DEVICE AND METHOD FOR MANUFACTURING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs. Hence, semiconductor manufacturing processes need continued improvement.

Static random access memory (SRAM) generally refers to any memory or storage that can retain stored data only when power is applied. SRAM chips may be used towards a variety of different applications requiring different performance characteristics. As IC technologies progress towards smaller technology nodes, gate-all-around (GAA) transistors have been incorporated into SRAMs to reduce chip footprint while maintaining reasonable processing margins. However, designing SRAM chips that include GAA transistors for multiple applications involves complex processes and is often particularly costly. Accordingly, although existing SRAM technologies have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6H-1, 6I-1, 6J-1, 6K-1, 6L-1, 6M-1 and 6N-1 are cross-sectional views of an embodiment of an SRAM cell of the present disclosure constructed at various fabrication stages along line A-A' of FIG. 1B, in accordance with some embodiments.

FIGS. 6H-2, 6I-2, 6J-2, 6K-2, 6L-2, 6M-2 and 6N-2 are cross-sectional views of an embodiment of an SRAM cell of the present disclosure constructed at various fabrication stages along line B-B' of FIG. 1B, in accordance with some embodiments.

FIG. 6N-3 is a cross-sectional view of an embodiment of an SRAM cell of the present disclosure constructed at various fabrication stages along line C-C' of FIG. 1B, in accordance with some embodiments.

DETAILED DESCRIPTION

Figure 1:
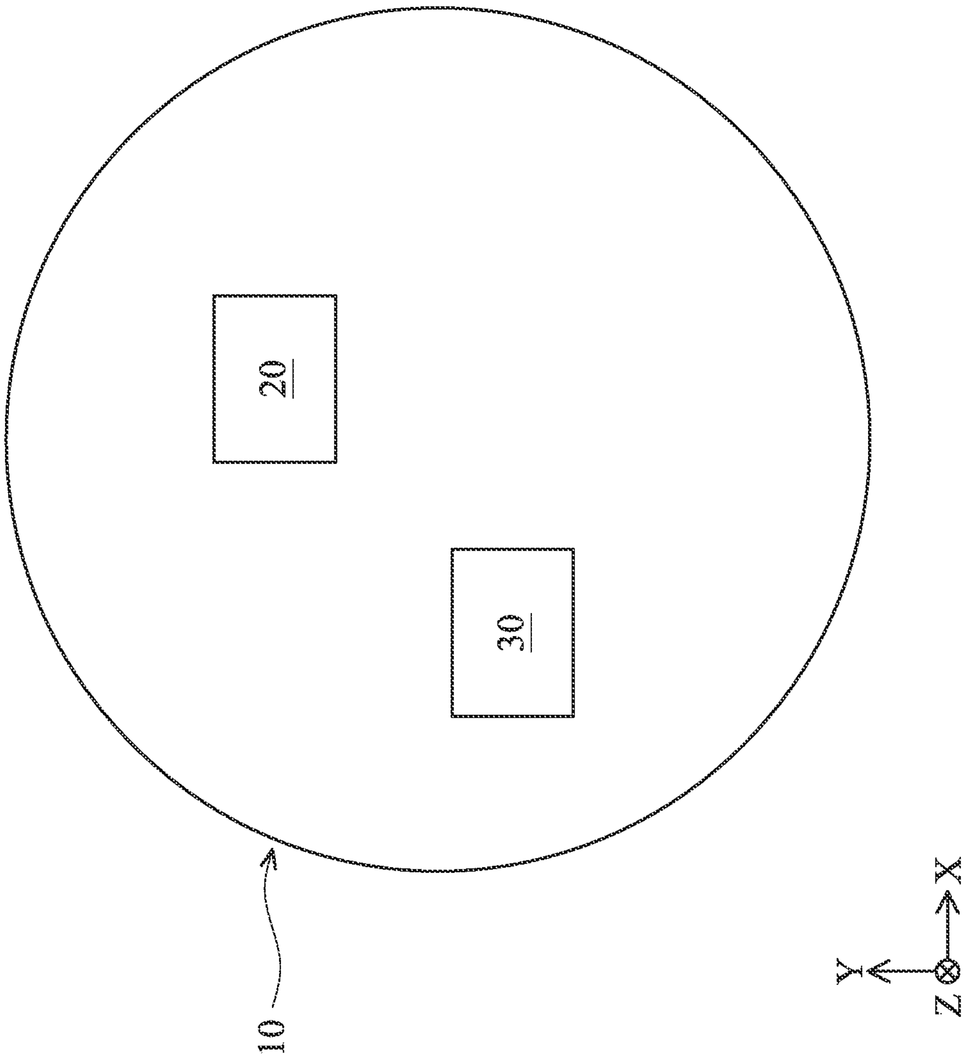
FIG. 1 is a fragmentary diagrammatic top view of an integrated circuit (IC) chip, in portion or entirety, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to memory devices, and more particularly to memory devices with field-effect transistors (FETs), such as three-dimensional gate-all-around (GAA) transistors, in an integrated circuit (IC) structure. Generally, a GAA transistor may include a plurality of vertically stacked sheets (e.g., nanosheets), wires (e.g., nanowires), or rods (e.g., nanorods) in a channel region of the transistor, thereby allowing better gate control, lowered leakage current, and improved scaling capability for various IC applications.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure also relates to layouts and structures thereof of memory devices. More particularly, the present disclosure relates to SRAM cell layout designs and structures. The present disclosure provides a compact SRAM cell design having a width of four poly pitches (the so-called four-poly-pitch SRAM cell) and with metal tracks (or conductors) on both a frontside and a backside of a substrate. Transistors such as gate-all-around (GAA) transistors forming the SRAM cell are fabricated on a frontside of the structure. Some of the metal tracks such as word lines and power supply (Vdd) lines are fabricated on the frontside of the structure. Other metal tracks such as bit lines and ground (Vss) lines are fabricated on the backside of the structure. The bit lines can be made wider than those metal tracks at the frontside, thereby reducing the resistance of the bit lines. Also, the bit lines and the Vss lines are spaced farther apart than those metal tracks at the frontside, thereby reducing the coupling capacitance of the bit lines. The SRAM layout according to the present disclosure is process friendly and lithography friendly, enabling better process margin.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures including dielectric structures used to replace gate structures of dummy transistors for disabling dummy transistors, instead of cutting active area (or OD (oxide diffusion) area) of dummy transistors. The details of the structure and fabrication methods of the present disclosure are described below in conjunction with the accompanying drawings, which illustrate layouts, structures, and processes of memory device with GAA transistors, according to some embodiments.

FIG. 1 is a fragmentary diagrammatic top view of an integrated circuit (IC) chip 10, in portion or entirety, according to various aspects of the present disclosure. IC chip 10 may include various passive microelectronic devices and active microelectronic devices, such as resistors, capacitors, inductors, diodes, p-type field effect transistors (PFETs), n-type field effect transistors (NFETs), metal-oxide semiconductor field effect transistors (MOSFETs), CMOS transistors, bipolar junction transistors (BJTs), laterally diffused MOS (LDMOS) transistors, high voltage transistors, high frequency transistors, other suitable components, or combinations thereof. The various microelectronic devices can be configured to provide IC chip 10 with functionally distinct regions, such as a core region (also referred to as a logic region), a memory region (e.g., a static random access memory (SRAM) region), an analog region, a peripheral region (also referred to as an input/output (I/O) region), a dummy region, and/or other suitable region. In some embodiments, IC chip 10 includes a memory region 20 and a logic region 30. Memory region 20 can include an array of memory cells, each of which includes transistors and interconnect structures (also referred to as routing structures) that combine to provide a storage device and/or a storage function, such as a flip flop, a latch, other suitable memory devices, or combinations thereof. In some embodiments, memory region 20 is configured with static random-access memory (SRAM) cells, dynamic random-access memory (DRAM) cells, non-volatile random-access memory (NVRAM) cells, flash memory cells, other suitable memory cells, or combinations thereof. Logic region 30 can include an array of standard cells, each of which includes transistors and interconnect structures that combine to provide a logic device and/or a logic function, such as an inverter, an AND gate, an NAND gate, an OR gate, an NOR gate, a NOT gate, an XOR gate, an XNOR gate, other suitable logic devices, or combinations thereof. FIG. 1 has been simplified for the sake of clarity to better understand the inventive concepts of the present disclosure. Additional features can be added in IC chip 10, and some of the features described herein can be replaced, modified, or eliminated in other embodiments of IC chip 10.

Figure 2:
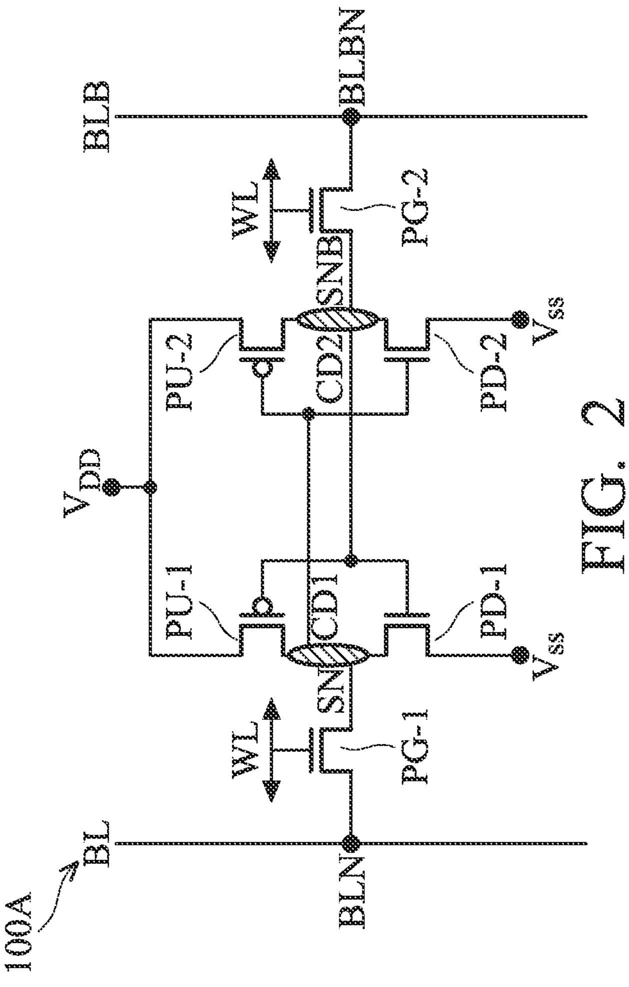
FIG. 2 and FIG. 3 are circuit diagrams of an SRAM circuit that can be implemented in an SRAM cell of a memory device in a memory region of FIG. 1, according to various aspects of the present disclosure.
Figure 3:
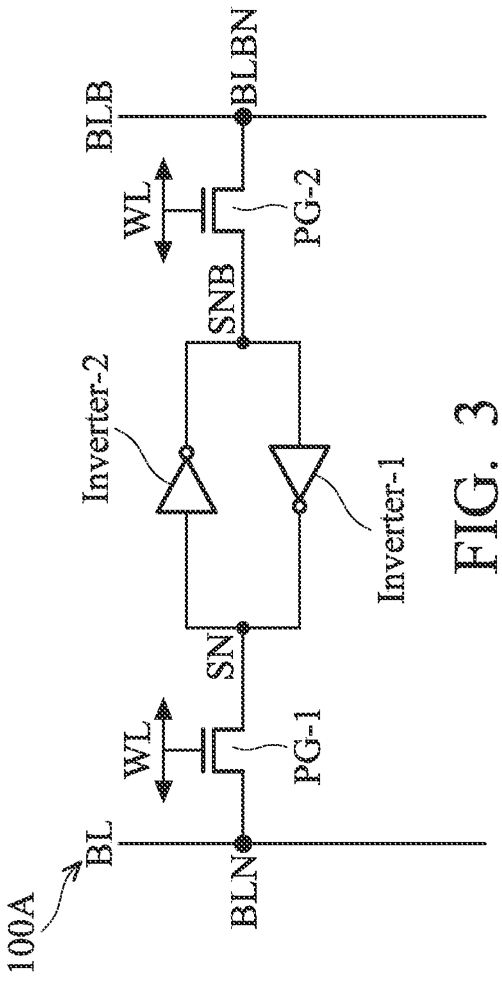
Figure 4:
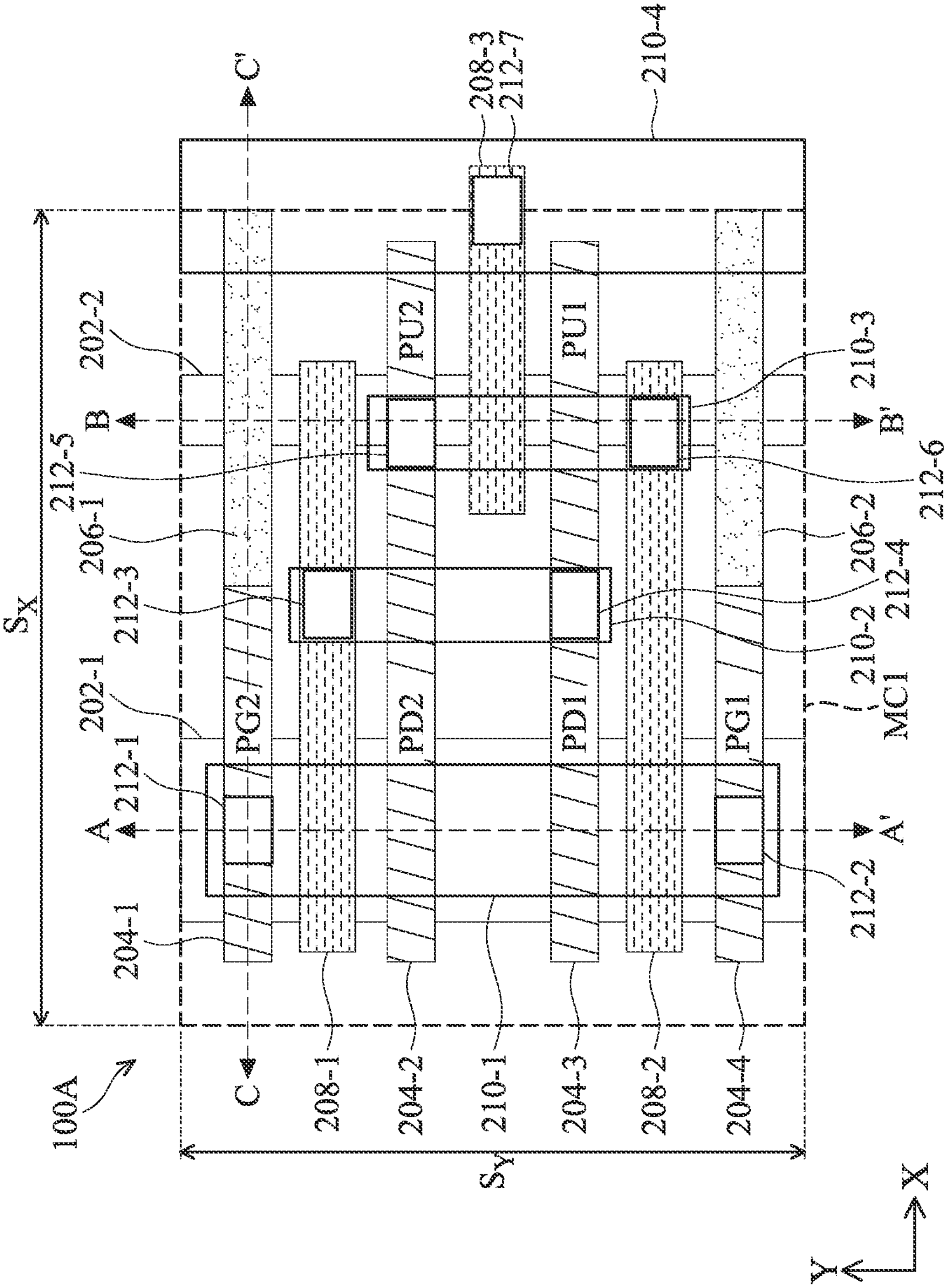
FIGS. 4 and 5 each shows a layout of an SRAM cell of a memory device in the memory region of FIG. 1, in accordance with some embodiments.

FIG. 2 and FIG. 3 are circuit diagrams of an SRAM circuit that can be implemented in an SRAM cell (e.g., an SRAM cell 100A in FIG. 4) of a memory device in the memory region 20 of FIG. 1, according to various aspects of the present disclosure. The circuit diagram of SRAM cell is merely exemplary, and in some embodiments, each of SRAM cells (e.g., SRAM cells 100A to 100D in FIG. 12) of the memory device is configured with an SRAM circuit similar to the SRAM cell 100A and as shown in FIG. 2 and FIG. 3. For example, each of SRAM cells has a storage portion that includes a cross-coupled pair of inverters (also referred to as a latch), such as an Inverter-1 and an Inverter-2. Inverter-1 includes pull-up transistor PU1 and pull-down transistor PD1, and Inverter-2 includes pull-up transistor PU2 and pull-down transistor PD2. Pass-gate transistor PG1 is connected to an output of Inverter-1 and an input of Inverter-2, and pass-gate transistor PG2 is connected to an output of Inverter-2 and an input of Inverter-1. In operation, pass-gate transistor PG1 and pass-gate transistor PG2 provide access to the storage portion of their respective SRAM cell (i.e., Inverter-1 and Inverter-2) and can also be referred to as access transistors of their respective SRAM cell. Each of SRAM cells (e.g., the SRAM cells 100A to 100D in FIG. 12) is connected to and powered through a first power supply voltage, such as a positive power supply voltage, and a second power supply voltage, such as a ground voltage or a reference voltage (which can be an electrical ground). A gate of pull-up transistor PU1 interposes a source, which is electrically coupled to the first power supply voltage via a voltage node (or voltage source) $V_{DD}$, and a first common drain (CD1) (i.e., a drain of pull-up transistor PU1 and a drain of pull-down transistor PD1). A gate of pull-down transistor PD1 interposes a source, which is electrically coupled to the second power supply voltage via a voltage node (or voltage source) $V_{SS}$, and the first common drain. A gate of pull-up transistor PU2 interposes a source, which is electrically coupled to the first power supply voltage via voltage node $V_{DD}$, and a second common drain (CD2) (i.e., a drain of pull-up transistor PU2 and a drain of pull-down transistor PD2). A gate of pull-down transistor PD2 interposes a source, which is electrically coupled to the second power supply voltage via voltage node $V_{SS}$, and the second common drain. The first common drain provides a storage node SN that stores data in true form, and the second common drain provides a storage node SNB that stores data in complementary form, or vice versa, in some embodiments. The gate of pull-up transistor PU1 and the gate of pulldown transistor PD-1 are coupled together and to the second common drain, and the gate of pull-up transistor PU2 and the gate of pull-down transistor PD2 are coupled together and to the first common drain. A gate of pass-gate transistor PG1 interposes a drain connected to a bit line node BLN, which is electrically coupled to a bit line BL, and a source, which is electrically coupled to the first common drain. A gate of pass-gate transistor PG2 interposes a drain connected to a complementary bit line node BLBN, which is electrically coupled to a complementary bit line BLB, and a source, which is electrically coupled to the second common drain. Gates of pass-gate transistors PG1, PG2 are connected to and controlled by a word line WL, which allows selection of a respective SRAM cell, such as the SRAM cell 100A, for reading and/or writing. In some embodiments, pass-gate transistors PG1, PG2 provide access to storage nodes SN, SNB, respectively, each of which can store a bit (e.g., a logical 0 or a logical 1), during read operations and/or write operations. For example, pass-gate transistors PG1, PG2 couple storage nodes SN, SNB, respectively, to bit line BL and bit line bar BLB in response to voltage applied to gates of pass-gate transistors PG1, PG2 by word line WL. In some embodiments, SRAM cells are single-port SRAMs. In some embodiments, SRAM cells are configured as multi-port SRAMs, such as dual-port SRAMs, and/or with more or less transistors than depicted, such as 8 T SRAMs. FIG. 3 and FIG. 4 have been simplified for the sake of clarity to better understand the inventive concepts of the present disclosure. Additional features can be added in the SRAM circuits of FIG. 2 and FIG. 3, and some of the features described herein can be replaced, modified, or eliminated in other embodiments of the SRAM circuits of FIG. 2 and FIG. 3.

Figure 5:
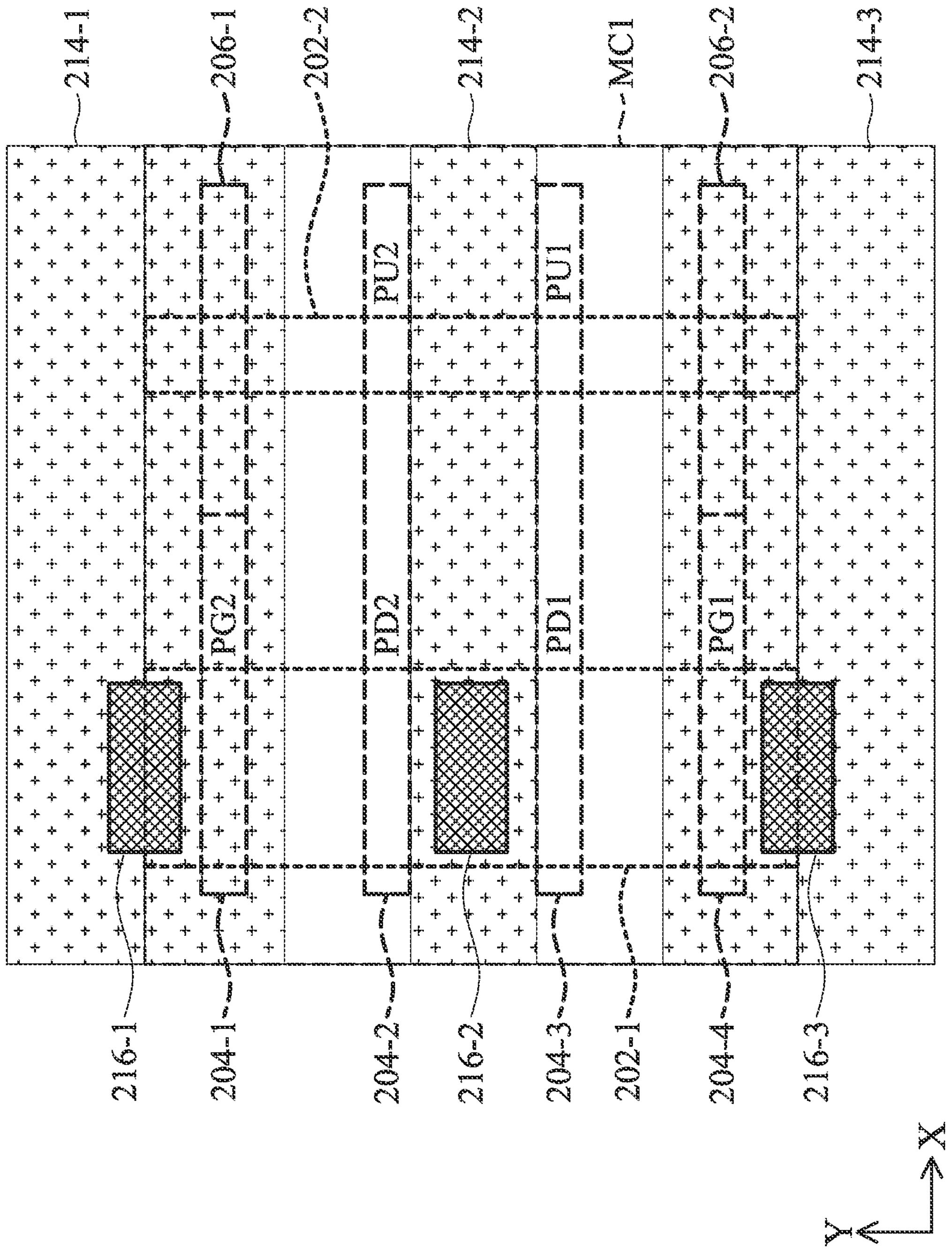

FIGS. 4 and 5 each shows a layout (or a top view) of the SRAM cell 100A of the memory device in the memory region 20 of FIG. 1, in accordance with some embodiments. Particularly, FIG. 4 shows the layout of the SRAM cell 100A that are implemented at a frontside of the memory device, and FIG. 5 shows the layout of the SRAM cell 100A that are implemented at a backside of the memory device.

Referring to FIG. 4, the SRAM cell 100A includes an active area 202-1 and an active area 202-2 (may be collectively referred to as active areas 202) extending lengthwise in a first direction (e.g., the Y-direction in FIG. 4) and arranged in a second direction (e.g., the X-direction in FIG. 4) perpendicular to the first direction; four gate structures 204-1, 204-2, 204-3, and 204-4 (may be collectively referred to as gate structures 204) extending lengthwise in the second direction and arranged in the first direction; and a dielectric structure 206-1 and a dielectric structure 206-2 (may be collectively referred to as dielectric structures 206) extending lengthwise in the second direction (e.g., the X-direction in FIG. 4) and across the active area 202-2.

The gate structures 204-1, 204-2, 204-3, and 204-4 are sometimes referred to as “poly” in some instances as polysilicon may be a material for making the gate structures 204-1, 204-2, 204-3, and 204-4 before it is replaced with metal gates. Since there are four gate structures 204-1, 204-2, 204-3, and 204-4 in the SRAM cell 100A, the SRAM cell 100A is referred to as having a four-poly pitch, thus the term four-poly-pitch SRAM cell.

As shown in FIG. 4, SRAM cell 100A has a cell boundary MC1. The cell boundary MC1 has a first dimension, a cell width $S_X$, in the second direction (e.g., x-pitch in the X-direction) and a second dimension, a cell height $S_Y$, along the first direction (e.g., y-pitch in the Y-direction). In some embodiments, the cell width $S_X$ is greater than the cell height $S_Y$. For example, a ratio of the cell width $S_X$ to the cell height $S_Y$ is greater than one. In some embodiments, the cell width $S_X$ has a dimension in a range from about 210 nm to about 300 nm. In some embodiments, the cell height $S_Y$ has a dimension in a range from about 140 nm to about 220 nm.

The gate structure 204-1 extends across the active area 202-1 in the top view and engages the active area 202-1 to form the pass-gate transistor PG2; the gate structure 204-2 extends across the active areas 202-1 and 202-2 in the top view and engages the active area 202-1 and 202-2 to form the pull-down transistor PD2 and the pull-up transistor PU2 respectively; the gate structure 204-3 extends across the active areas 202-1 and 202-2 in the top view and engages the active area 202-1 and 202-2 to form the pull-down transistor PD1 and the pull-up transistor PU1 respectively; and the gate structure 204-4 extends across the active area 202-1 in the top view and engages the active area 202-1 to form the pass-gate transistor PG1. Further, the pull-down transistor PD1 and the pull-up transistor PU1 share the gate structure 204-3, and the pull-down transistor PD2 and the pull-up transistor PU2 share the gate structure 204-2, so that the gate structure 204-3 and the gate structure 204-2 are also referred to as common gates.

Since the pass-gate transistor PG1, pull-down transistor PD1, pull-down transistor PD2, and pass-gate transistor PG2 are arranged in the first direction and share (or over) the same active area 202-1, their performance (such as threshold voltage) are more uniform than in approaches where they are formed over different active areas. Similarly, since the pull-up transistors PU1 and PU2 are arranged in the first direction and share (or are over) the same active area 202-2, their performance (such as threshold voltage) are more uniform than in approaches where they are formed over different active areas.

As shown in FIG. 4, the dielectric structure 206-1, the dielectric structure 206-2 are also arranged with the pull-up transistors PU1 and PU2 in the first direction and share (or over) the same active area 202-2. The pull-up transistor PU1 and the pull-up transistor PU2 (or the gate structure 204-3 and the gate structure 204-2) are between the dielectric structure 206-1 and the dielectric structure 206-2. Further, the dielectric structure 206-1 and the gate structure 204-1 are aligned with each other in the second direction, and the dielectric structure 206-2 and the gate structure the 204-4 are aligned with each other in the second direction. In some embodiments, the dielectric structure 206-1 is in contact with the gate structure 204-1, and the dielectric structure 206-2 is in contact with the gate structure the 204-4, as shown in FIG. 4. In some embodiments, the dielectric structures 206-1 and 206-2 each has a dimension in the first direction in a range from about 1 nm to about 7 nm. In some embodiments, the dielectric structures 206-1 and 206-2 for the SRAM cell 100A each has a dimension in the second direction in a range from about 40 nm to about 60 nm.

The active areas 202-1 and 202-2 may be formed by ion implantation, diffusion, or other doping processes. For example, the active area 202-2 may be doped with n-type dopants, such as phosphorus, arsenic, other n-type dopant, or combinations thereof; and the active region 202-1 may be doped with p-type dopants, such as boron, indium, other p-type dopant, or combinations thereof. The active areas 202-1 and 202-2 may take the form of single well structures, dual-well structures, raised structures, semiconductor fins, or other shapes. In some embodiments, the active area 202-1 has a dimension in the second direction in a range from about 10 nm to about 50 nm. In some embodiments, the active area 202-2 has a dimension in the second direction in a range from about 10 nm to about 15 nm. The dimension of the active area 202-1 in the second direction is greater than the dimension of the active area 202-2 in the second direction. In some embodiments, the active areas 202-1 and 202-2 are GAA-based active areas, where channel regions thereof are formed by vertically stacked n-type semiconductor layers or vertically stacked p-type semiconductor layers, respectively. It is noted that source/drain features are provided over the active areas and are doped with conductivity type opposite to the respective active area. For example, n-type source/drain features are provided over the p-type active region 202-1 for forming the NMOS transistors (e.g., the pass-gate transistor PG1, the pull-down transistor PD1, the pull-down transistor PD2, and the pass-gate transistor PG2), and p-type source/drain features are provided over the n-type active region 202-2 for forming the PMOS transistors (e.g., the pull-up transistors PU1 and PU2).

Still referring to FIG. 4, the layout of the SRAM cell 100A further includes source/drain (or S/D) contacts 208-1, 208-2, and 208-3 (may be collectively referred to as source/drain contacts 208) extending lengthwise in the second direction (e.g., the X-direction in FIG. 4). In the top view, the source/drain contact 208-1 is between the gate structures 204-1 and 204-2 (or between the pass-gate transistor PG2 and the pull-down transistor PD2) in the first direction; the source/drain contact 208-2 is between the gate structures 204-3 and 204-4 (or between the pass-gate transistor PG1 and the pull-down transistor PD1) in the first direction; and the source/drain contact 208-3 is between the gate structures 204-2 and 204-3 (or between the pull-up transistors PU1 and PU2) in the first direction. Further, the source/drain contacts 208-1 and 208-2 extend across the active areas 202-1 and 202-2 in the top view; and the source/drain contact 208-3 extends across the active area 202-2 in the top view. Moreover, the source/drain contact 208-1 electrically couples to the source/drain feature of the pass-gate transistor PG2 and the pull-down transistor PD2 (or common drain) and the source/drain feature of the pull-up transistor PU2, which corresponds to the storage node SNB shown in FIG. 2. The source/drain contact 208-2 electrically couples to the source/drain feature of the pass-gate transistor PG1 and the pull-down transistor PD1 (or common drain) and the source/drain feature of the pull-up transistor PU1, which corresponds to the storage node SN shown in FIG. 2. The source/drain contact 208-3 electrically couples to the source/drain feature of the pull-up transistors PU1 and PU2 (or common source) and the metal line 210-4.

Referring to FIG. 4, the layout of the SRAM cell 100A further includes metal lines (metal tracks or metal conductors) 210-1, 210-2, 210-3, and 210-4 (may be collectively referred to as metal lines 210) extending lengthwise in the first direction (e.g., the Y-direction in FIG. 4). The metal lines 210-1 to 210-4 are over the source/drain contacts 208-1 to 208-3, the gate structures 204-1 to 204-4, and the dielectric structures 206-1 and 206-2. As shown in FIG. 4, in the top view, the metal line 210-1 overlaps the active area 202-1 and is across the gate structures 204-1 to 204-4 and the source/drain contacts 208-1 and 208-2; the metal line 210-2 is between the active areas 202-1 and 202-2 and is across the gate structures 204-2 and 204-3 and the source/drain contact 208-1; the metal line 210-3 partially overlaps the active area 202-2 and is across the gate structures 204-2 and 204-3 and the source/drain contacts 208-2 and 208-3; and the metal line 210-4 partially overlaps the gate structures 204-2 and 204-3 and is across the dielectric structures 206-1 and 206-2 and the source/drain contact 208-3.

The layout of the SRAM cell 100A further includes vias 212-1 to 212-7 (may be collectively referred to as vias 212) that provide vertical connection. Specifically, the vias 212-1, 212-2, 212-4, and 212-5 provide vertical connection between the gate structures and the metal lines, and the vias 212-3, 212-6, and 212-7 provide vertical connection between the source/drain contacts and the metal lines. For example, the vias 212-1, 212-2, 212-4, and 212-5 are vertically (e.g., in a Z-direction) between the gate structures 204-1 to 204-4 and the metal lines 210-1 to 210-3, and the vias 212-3, 212-6, and 212-7 are vertically between the source/drain contacts 208-1 to 208-3 and the metal lines 210-2 to 210-4.

In some embodiments, the metal line 220-1 is connected to the gate structures 204-1 and 204-4 through the vias 212-1 and 212-2, respectively; the metal line 210-2 is connected to the source/drain contact 208-1 and the gate structure 204-3 through the vias 212-3 and 212-4, respectively; the metal line 210-3 is connected to the source/drain contact 208-2 and the gate structure 204-2 through the vias 212-5 and 212-6, respectively; and the metal line 210-4 is connected to the source/drain contact 208-3 through the vias 212-7. Since the metal line 210-2 is connected to the source/drain contact 208-1 that corresponds to the storage node SNB and the metal line 210-3 is connected to the source/drain contact 208-1 that corresponds to the storage node SNB, the metal lines 210-2 and 210-3 may also be referred to as node lines or node conductors. The metal line 210-1 serves as word line (WL) of the SRAM cell 100A to control the gate structure 204-1 of the pass-gate transistor PG2 and the gate structure 204-4 of the pass-gate transistor PG1, such that the metal line 210-1 may also be referred to as word line or word line conductor. The metal line 210-4 is coupled to the power supply voltage ($V_{DD}$) (not shown) to serves as voltage node $V_{DD}$ of the SRAM cell 100A to supply voltage to the source/drain contact 208-3 (and further supply voltage to the source/drain feature of the pull-up transistors PU1 and PU2), such that the metal line 210-4 may also be referred to as $V_{DD}$ line, power supply line, or power supply conductor.

Referring to FIG. 5, on the backside, the layout of the SRAM cell 100A further includes metal lines (metal tracks or metal conductors) 214-1, 214-2, and 214-3 (may be collectively referred to as metal lines 214) extending lengthwise in the second direction (e.g., the X-direction in FIG. 4). The active areas 202-1 and 202-2, the gate structures 204-1 to 204-4, and the dielectric structures 206-1 and 206-2 are shown in dashed lines to illustrate the relative positions of these features. The metal lines 214-1 to 214-3 are under the gate structures 204-1 to 204-4, and the dielectric structures 206-1 and 206-2. As shown in FIG. 5, in the top view, the metal line 214-1 overlaps the gate structure 204-1; the metal line 214-2 is between the gate structures 204-2 and 204-3; and the metal line 210-3 overlaps the gate structure 204-4. In some embodiments, the metal line 214-2 is enlarged to overlap the gate structure 204-2, the gate structure 204-3, or both.

The layout of the SRAM cell 100A further includes backside vias 216-1, 216-2, and 216-3 (may be collectively referred to as backside vias 216) that connect the metal lines 214-1, 214-2, and 214-3 to the frontside features respectively. Particularly, the backside via 216-1 connects metal line 214-1 to the source/drain feature of the pass-gate transistor PG2; the backside via 216-2 connects metal line 214-2 to the source/drain feature of the pull-down transistors PD1 and PD2; and the backside via 216-3 connects metal line 214-3 to the source/drain feature of the pass-gate transistor PG1.

The metal lines 214-1 and 214-3 respectively serves as complementary bit line (BLB) and bit line (BL), such that the metal line 214-1 may also be referred to as complementary bit line or complementary bit line conductor and the metal line 214-3 may also be referred to as bit line or bit line conductor. The metal line 214-2 is coupled to the power supply voltage ($V_{SS}$) (not shown) to serves as voltage node $V_{SS}$ of the SRAM cell 100A to supply voltage to the source/drain feature of the pull-down transistors PD1 and PD2, such that the metal line 214-2 may also be referred to as $V_{SS}$ line, power supply line, or power supply conductor.

By moving the metal lines used for BL, BLB, and $V_{SS}$ to the backside of the SRAM cell, the connections between these metal lines and the respective source/drain features of transistors PD1, PD2, PG1, PG2 become shorter in the present embodiment than in approaches where the metal lines used for BL, BLB, and $V_{SS}$ are implemented at the frontside of the SRAM cell. Further, the metal lines used for BL, BLB, and $V_{SS}$ can be made wider in the present embodiment to reduce resistance. Still further, the coupling capacitance between the gate structures and the metal lines used for BL and BLB is practically negligible in the present embodiment and is much smaller than in approaches where the metal lines used for BL and BLB are implemented at the frontside of the memory device.

In one structure, the gate structures 204-1 and 204-2 of the pass-gate transistors PG1 and PG2 extend across two active areas 202-1 and 202-2 in the top view and engage the two active areas 202-1 and 202-2. Such structure additionally forms two dummy transistors arranged with the pull-up transistors PU1 and PU2 in the first direction in addition to the formation of the pass-gate transistors PG1 and PG2. In order to turn off the dummy transistors or make the dummy transistors not to affect other adjacent SRAM cells in the first direction, a cut process is performed to cut the active area 202-2 into segments for each SRAM cell in the same column. Such cut process may use costly lithography and etching processes (e.g., extreme ultraviolet (EUV) processes) and may use an extra mask since it's cannot integrate to the mask of a cut process used for logic devices.

In the present disclosure, the dielectric structures 206-1 and 206-2 are used for replacing the gate structures 204-1 and 204-2 over the active area 202-2 to turn off the dummy transistors or make the dummy transistors fail. Processes for forming the dielectric structures 206-1 and 206-2 are lithography friendly and cost reduction (no EUV processes and extra mask). The processes for forming the dielectric structures 206-1 and 206-2 are discussed in detail below.

Figure 6A:
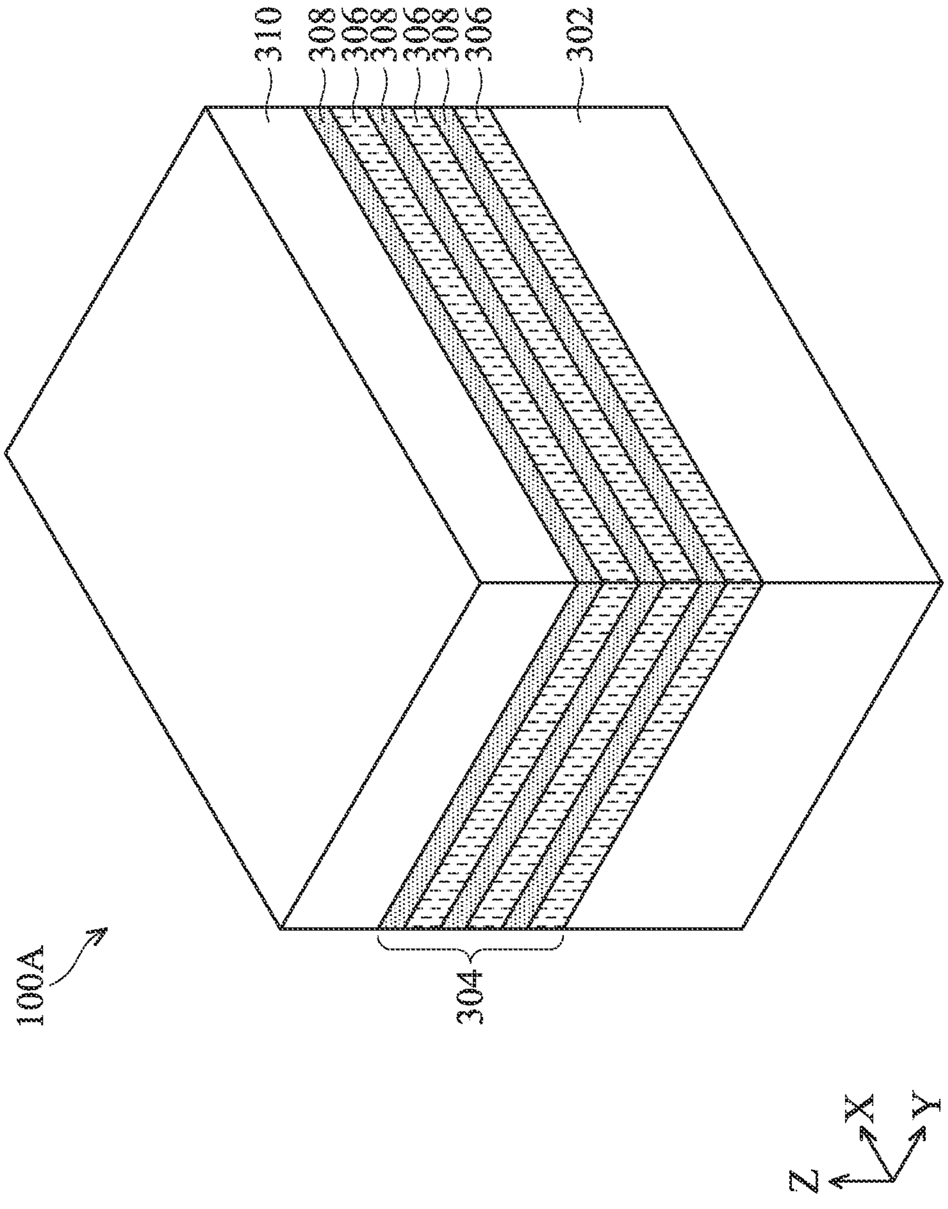
FIGS. 6A and 6B are isometric views of an embodiment of an SRAM cell of the present disclosure constructed at various fabrication stages, in accordance with some embodiments.
Figure 6B:
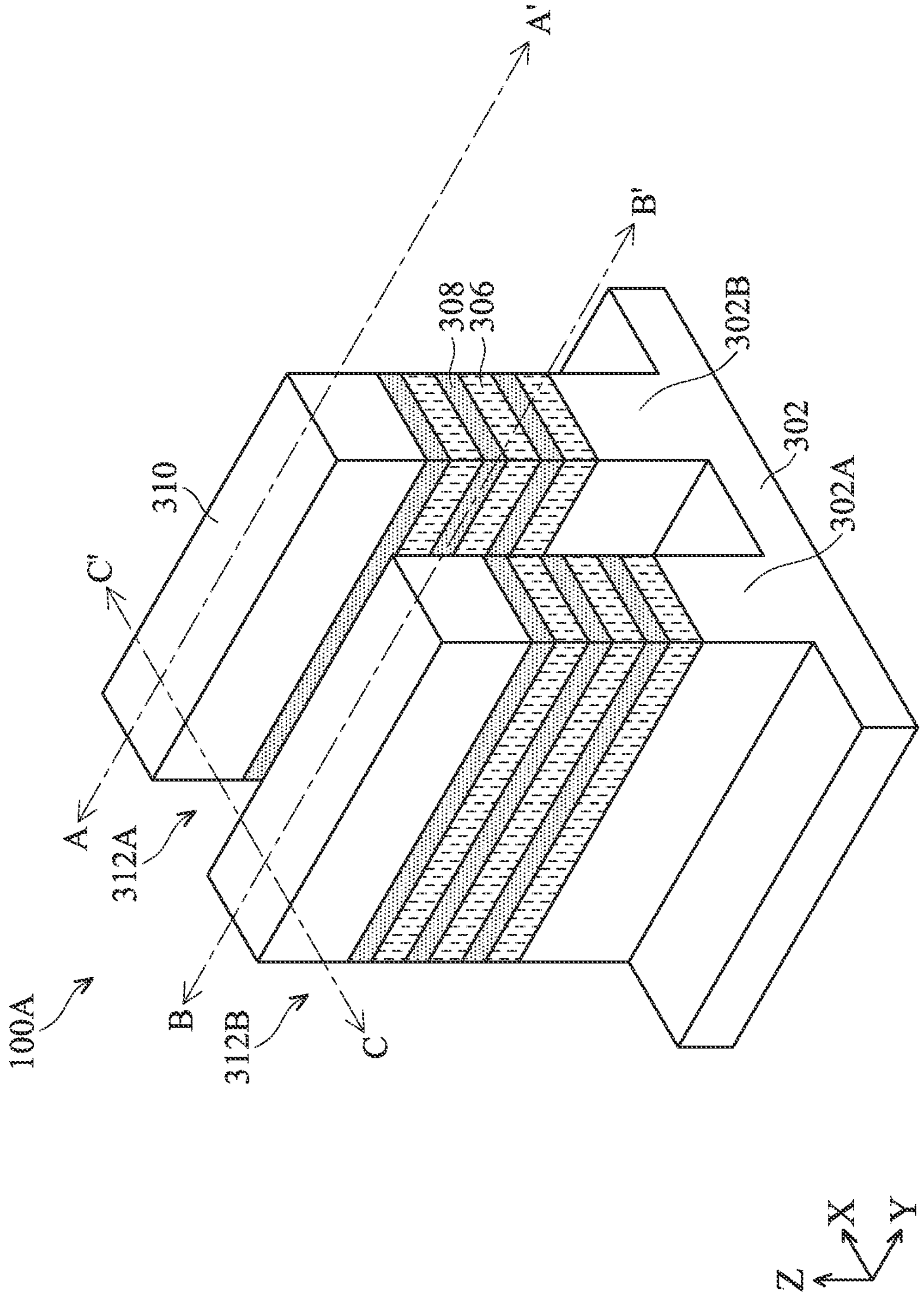

FIGS. 6A and 6B are isometric views of an embodiment of the SRAM cell 100A of the present disclosure constructed at various fabrication stages, in accordance with some embodiments. FIGS. 6C, 6D, 6E, 6F and 6G are cross-sectional views of an embodiment of the SRAM cell 100A of the present disclosure constructed at various fabrication stages along line A-A' and/or B-B' of FIG. 1B, in accordance with some embodiments. FIGS. 6H-1, 6I-1, 6J-1, 6K-1, 6L-1, 6M-1 and 6N-1 are cross-sectional views of an embodiment of the SRAM cell 100A of the present disclosure constructed at various fabrication stages along line A-A' of FIG. 1B, in accordance with some embodiments. FIGS. 6H-2, 6I-2, 6J-2, 6K-2, 6L-2, 6M-2 and 6N-2 are cross-sectional views of an embodiment of the SRAM cell 100A of the present disclosure constructed at various fabrication stages along line B-B' of FIG. 1B, in accordance with some embodiments. FIG. 6N-3 is a cross-sectional view of an embodiment of the SRAM cell 100A of the present disclosure constructed at various fabrication stages along line C-C' of FIG. 1B, in accordance with some embodiments.

Referring to FIG. 6A, a substrate 302 and a layer stack 304 over the substrate 302 are provided. In some embodiments, the substrate 302 contains a semiconductor material, such as bulk silicon (Si). In some other embodiments, the substrate 302 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 302 may also include an insulating layer, such as a silicon oxide layer, to have a silicon-on-insulator (SOI) structure or a germanium-on-insulator (GOI) structure. In some embodiments, the substrate 302 may include one or more well regions, such as n-type well regions doped with an n-type dopant (i.e., phosphorus (P) or arsenic (As)) or p-type well regions doped with a p-type dopant (i.e., boron (B)), for forming different types of devices. The doping the n-type wells and the p-type wells may be formed using ion implantation or thermal diffusion.

The layer stack 304 includes semiconductor layers 306 and 308, and the semiconductor layers 306 and 308 are alternately stacked in a third direction (e.g., a Z-direction in FIG. 6A) perpendicular to the first direction (e.g., the Y-direction in FIGS. 4 and 6A) and the second direction (e.g., the X-direction in FIGS. 4 and 6A) discussed above. The semiconductor layers 306 and the semiconductor layers 308 may have different semiconductor compositions. The semiconductor layers 306 and the semiconductor layers 308 include a semiconductor material, such as silicon, germanium, silicon germanium, silicon carbide, gallium arsenide, gallium phosphide, indium phosphide, indium arsenide, indium antimonide, GaAsP, AlInAs, AlGaAs, GaInAs, GaInP, GaInAsP, or combinations thereof. In some embodiments, semiconductor layers 306 are formed of silicon germanium (SiGe) and the semiconductor layers 308 are formed of silicon (Si). In these embodiments, the additional germanium content in the semiconductor layers 306 allow selective removal or recess of the semiconductor layers 306 without substantial damages to the semiconductor layers 308, so that the semiconductor layers 306 are also referred to as sacrificial layers. In some embodiments, the semiconductor layers 306 and the semiconductor layers 308 include n-type dopants (e.g., phosphorus, arsenic, other n-type dopant, or combinations thereof) and/or p-type dopants (e.g., boron, indium, other p-type dopant, or combinations thereof). In some embodiments, the semiconductor layers 306 and 308 are epitaxially grown over (on) the substrate 302 using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer deposition (ALD), ultrahigh vacuum CVD (UHVCVD), reduced pressure CVD (RPCVD), a combination thereof, or the like, may also be utilized. The semiconductor layers 306 and the semiconductor layers 308 are deposited alternatingly, one-after-another, to form the layer stack 304. It should be noted that three (3) layers of the semiconductor layers 306 and three (3) layers of the semiconductor layers 308 are alternately and vertically arranged (or stacked) as shown in FIG. 6A, which are for illustrative purposes only and not intended to be limiting beyond what is specifically recited in the claims. The number of layers depends on the desired number of channels members for the semiconductor device. In some embodiments, there may be from 2 to 10 semiconductor layers 306 alternating with 2 to 10 semiconductor layers 308 in the layer stack 304.

For patterning purposes, the SRAM cell 100A may also include a hard mask layer 310 over the layer stack 304. The hard mask layer 310 may be a single layer or a multilayer. In some embodiments, the hard mask layer 310 is a single layer and includes a silicon germanium layer. In some embodiments, the hard mask layer 310 is a multi-layer and includes a silicon nitride layer and a silicon oxide layer over the silicon nitride layer. In some other embodiments, the hard mask layer 310 is a multi-layer and includes a silicon germanium layer and a silicon layer over the silicon germanium layer.

Referring to FIG. 6B, the substrate 302, the layer stack 304 and the hard mask layer 310 are then patterned to form stacks 312A and 312B (may be collectively referred to as stacks 312) over the substrate 302. As shown in FIG. 6B, each of the stacks 312 includes a base portion (302A and 302B) formed from a portion of the substrate 302 and a stack portion formed from the layer stack 104 over the base portion. The stacks 312 extend lengthwise in the first direction, are arranged in the second direction, and extend vertically in the third direction over the substrate 302. The stacks 312A and 312B each has the semiconductor layers 306 and 308 alternately stacked in the third direction.

The stacks 312A and 312B may be patterned using suitable processes including double-patterning or multi-patterning processes. For example, in some embodiment, a material layer is formed over a substrate and patterned using a photolithography process. Spacers are formed alongside the patterned material layer using a self-aligned process. The material layer is then removed, and the remaining spacers, or mandrels, may then be used to pattern the stacks 312A and 312B by etching the layer stack 304 and the substrate 302. The etching process may include dry etching, wet etching, reactive ion etching (RIE), and/or other suitable processes.

Figure 6C:
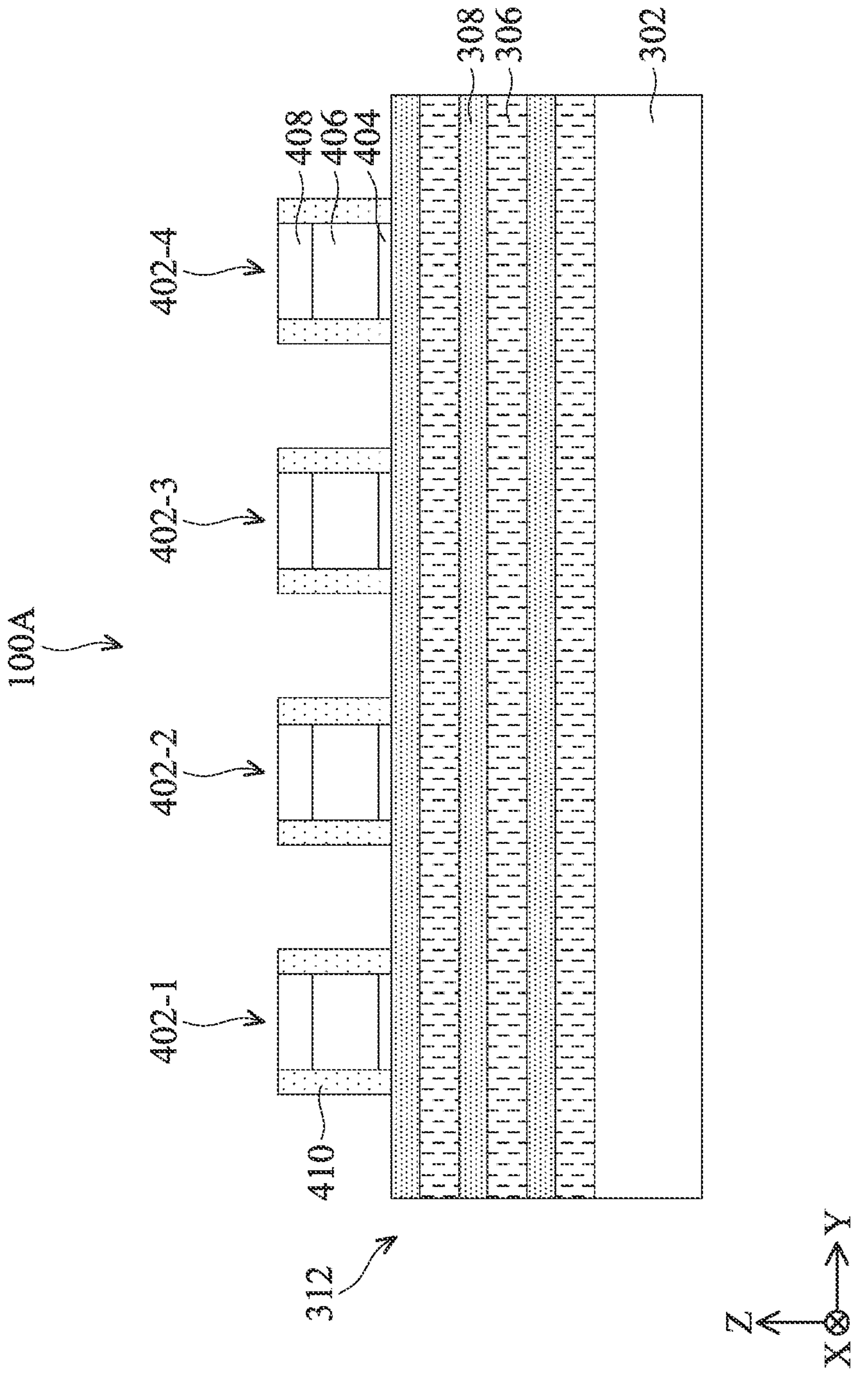
FIGS. 6C, 6D, 6E, 6F and 6G are cross-sectional views of an embodiment of an SRAM cell of the present disclosure constructed at various fabrication stages along line A-A' and/or B-B' of FIG. 1B, in accordance with some embodiments.

Referring to FIG. 6C, the hard mask layer 110 may be removed and dummy gate structures 402-1 to 402-4 (may be collectively referred to as gate structures 402) may be then formed over the stacks 312. The dummy gate structure 402 may be configured to extend in the second direction and arrange in the first direction. In some embodiments, to form the dummy gate structure 402, a dummy interfacial material for dummy interfacial layers 404 is first formed over the stacks 312. In some embodiments, the dummy interfacial material may include, for example, a dielectric material such as a nitride (e.g., silicon nitride, silicon oxynitride), a carbide (e.g., silicon carbide), an oxide (e.g., silicon oxide), or some other suitable material. Then, in some embodiments, a dummy gate material for dummy gate electrodes 406 is formed over the dummy interfacial material. The dummy gate material may include a conductive material selected from a group comprising of polysilicon, W, Al, Cu, AlCu, Ti, TiAlN, TaC, TaCN, TaSiN, Mn, Zr, TiN, Ta, TaN, Co, Ni, and/or combinations thereof. The dummy gate material and/or the dummy interfacial material may be formed by way of a thermal oxidation process and/or a deposition process (e.g., PVD, CVD, PECVD, and ALD).

Then, hard mask layers 408 are formed over the dummy gate material. In some embodiments, the hard mask layers 408 may be formed using photolithography and removal (e.g., etching) processes. In some embodiments, the hard mask layers 408 may include photoresist materials or hard mask materials. In some embodiments, each of the hard mask layers 408 may include multiple layers, such as a silicon nitride layer and a silicon oxide layer. After the formation of the hard mask layers 408, a removal process (e.g., etching) may be performed to remove portions of the dummy gate material for the dummy gate electrodes 406 and the dummy interfacial material for the dummy interfacial layers 404 that do not directly underlie the hard mask layers 408, thereby forming the dummy gate structures 402 each having the dummy interfacial layer 404, the dummy gate electrode 406, and the hard mask layer 408. The dummy interfacial layer 404 may also be referred to as dummy gate dielectric. The dummy gate structures 402 may undergo a gate replacement process through subsequent processing to form the gate structures 204-1 to 204-4 discussed above.

Still referring to FIG. 6C, gate spacers 410 are formed on sidewalls of the dummy gate structures 402 and over top surface of the stacks 312. The gate spacers 410 may include silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, or combinations thereof. The gate spacers 410 may include a single layer or a multi-layer structure. In some embodiments, the gate spacers 410 may be formed by depositing a spacer layer (containing the dielectric material) conformally over the stacks 312 and the dummy gate structures 402, followed by an anisotropic etching process to remove top portions of the spacer layer from the top surfaces of the stacks 312 and the dummy gate structures 402. After the etching process, portions of the spacer layer on the sidewalls of the dummy gate structures 402 and the stacks 312 substantially remain and become the gate spacers 410. In some embodiments, the anisotropic etching process is a dry (e.g., plasma) etching process. Additionally or alternatively, the formation of the gate spacers 410 may also involve chemical oxidation, thermal oxidation, ALD, CVD, and/or other suitable methods. The gate spacers 410 may also be interchangeably referred to as the top spacers or gate top spacers.

Figure 6D:
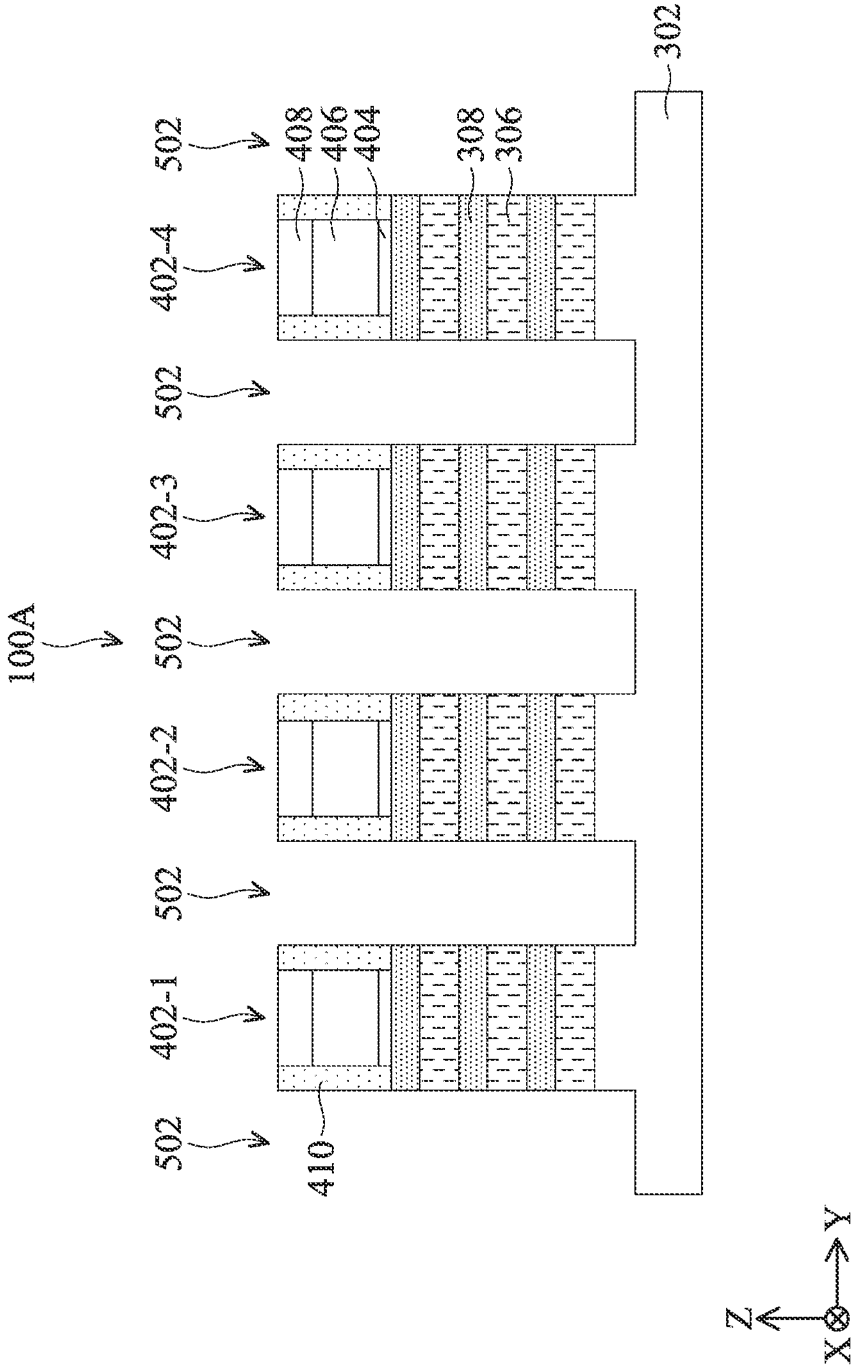

Referring to FIG. 6D, the stacks 312 are recessed to form source/drain trenches 502 in the stacks 312 (or passing through the semiconductor layers 306 and 308). Specifically, the source/drain trenches 502 may be formed by performing one or more etching processes to remove portions of the semiconductor layers 306, the semiconductor layers 308, and the substrate 302 that do not vertically overlap or be covered by the dummy gate structures 402 and the gate spacers 410. In some embodiments, a single etchant may be used to remove the semiconductor layers 306, the semiconductor layers 308, and the substrate 302, whereas in other embodiments, multiple etchants may be used to perform the etching process. As shown in FIG. 6D, portions of the substrate 302 are etched, so that bottom surfaces of the source/drain trenches 502 are lower than a topmost surface of the substrate 302.

Figure 6E:
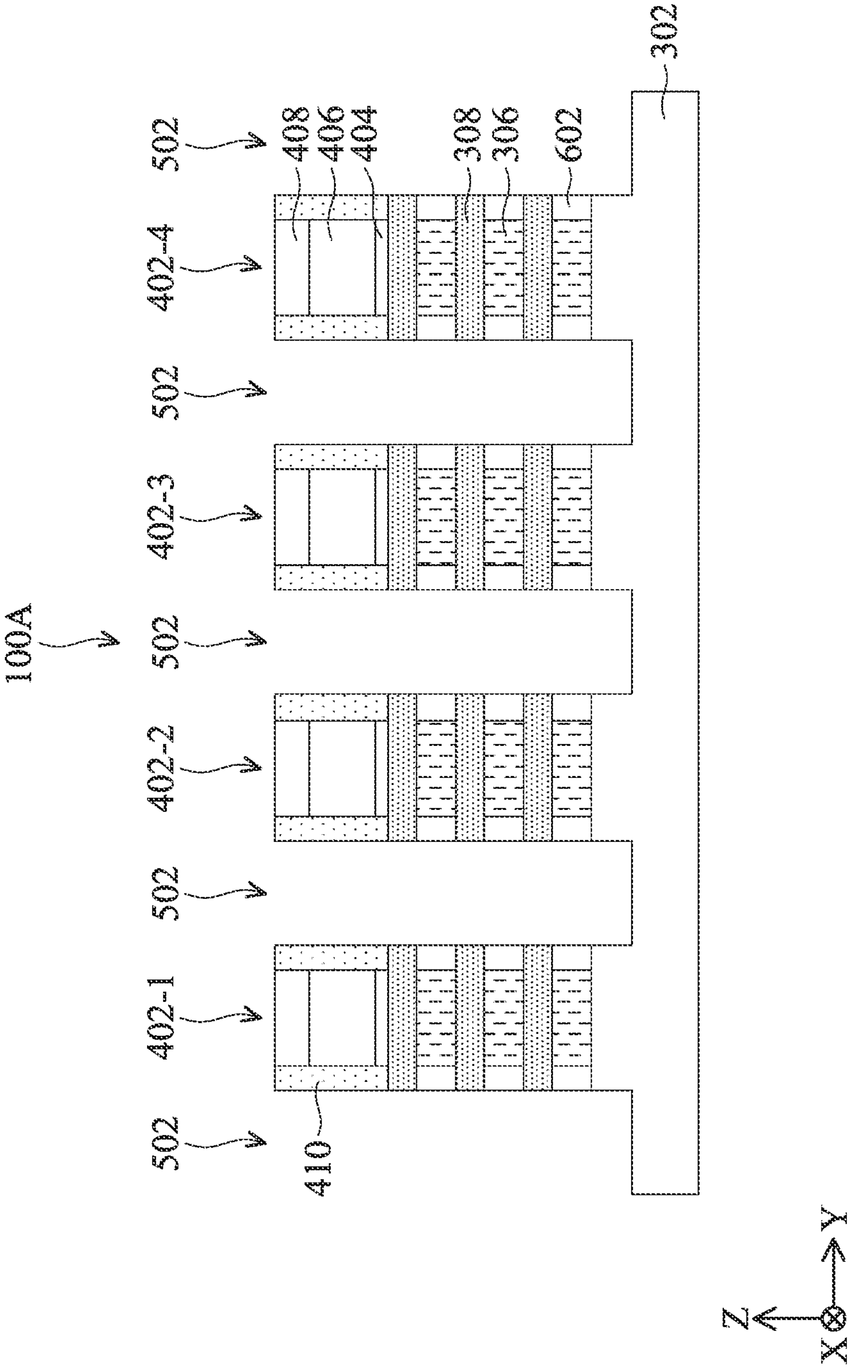

Referring to FIG. 6E, inner spacers 602 are formed under the gate spacers 410 and between the semiconductor layers 308 as well as between the semiconductor layers 308 and the substrate 302. In formation of the inner spacers 602, side portions of the semiconductor layers 306 are removed via a selective etching process. Specifically, the selective etching process is performed that selectively etches the side portions of the semiconductor layers 306 under the gate spacers 410 through the source/drain trenches 502, with minimal (or no) etching of semiconductor layers 308, such that gaps are formed between the semiconductor layers 308 as well as between the semiconductor layers 308 and the substrate 302. The etching process is configured to laterally etch (e.g., in the first direction) the semiconductor layers 306 below the gate spacers 410. The selective etching process is a dry etching process, a wet etching process, other suitable etching process, or combinations thereof.

Still referring to FIG. 6E, the inner spacers 602 are then formed to fill the gaps. In some embodiments, sidewalls of the inner spacers 602 are aligned to sidewalls of the gate spacers 410 and the semiconductor layers 308, as shown in FIG. 6E. In order to form the inner spacers 602, a deposition process forms a spacer layer into the source/drain trenches 502 and the gaps, such as CVD, PVD, ALD, HDPCVD, MOCVD, RPCVD, PECVD, LPCVD, ALCVD, APCVD, other suitable methods, or combinations thereof. The spacer layer partially (and, in some embodiments, completely) fills the source/drain trenches 502. The deposition process is configured to ensure that the spacer layer fills the gaps between the semiconductor layers 308 as well as between the semiconductor layer 308 and the substrate 302 under the gate spacers 410. An etching process is then performed that selectively etches the spacer layer to form inner spacers 602 (as shown in FIG. 6E) with minimal (to no) etching of the semiconductor layer 308, the substrate 302, the dummy gate structures 402, and the gate spacers 410. The spacer layer (and thus inner spacers 602) includes a material that is different than a material of the semiconductor layers 308 and a material of the gate spacers 410 to achieve desired etching selectivity during the etching process. In some embodiments, the inner spacers 602 include a dielectric material that includes silicon, oxygen, carbon, nitrogen, other suitable material, or combinations thereof (for example, silicon oxide ($SiO_2$), silicon oxynitride (SiON), silicon oxycarbide (SiOC), silicon oxycarbon nitride (SiOCN)). In some embodiments, the inner spacers 602 include a low-k dielectric material, such as those described herein.

Figure 6F:
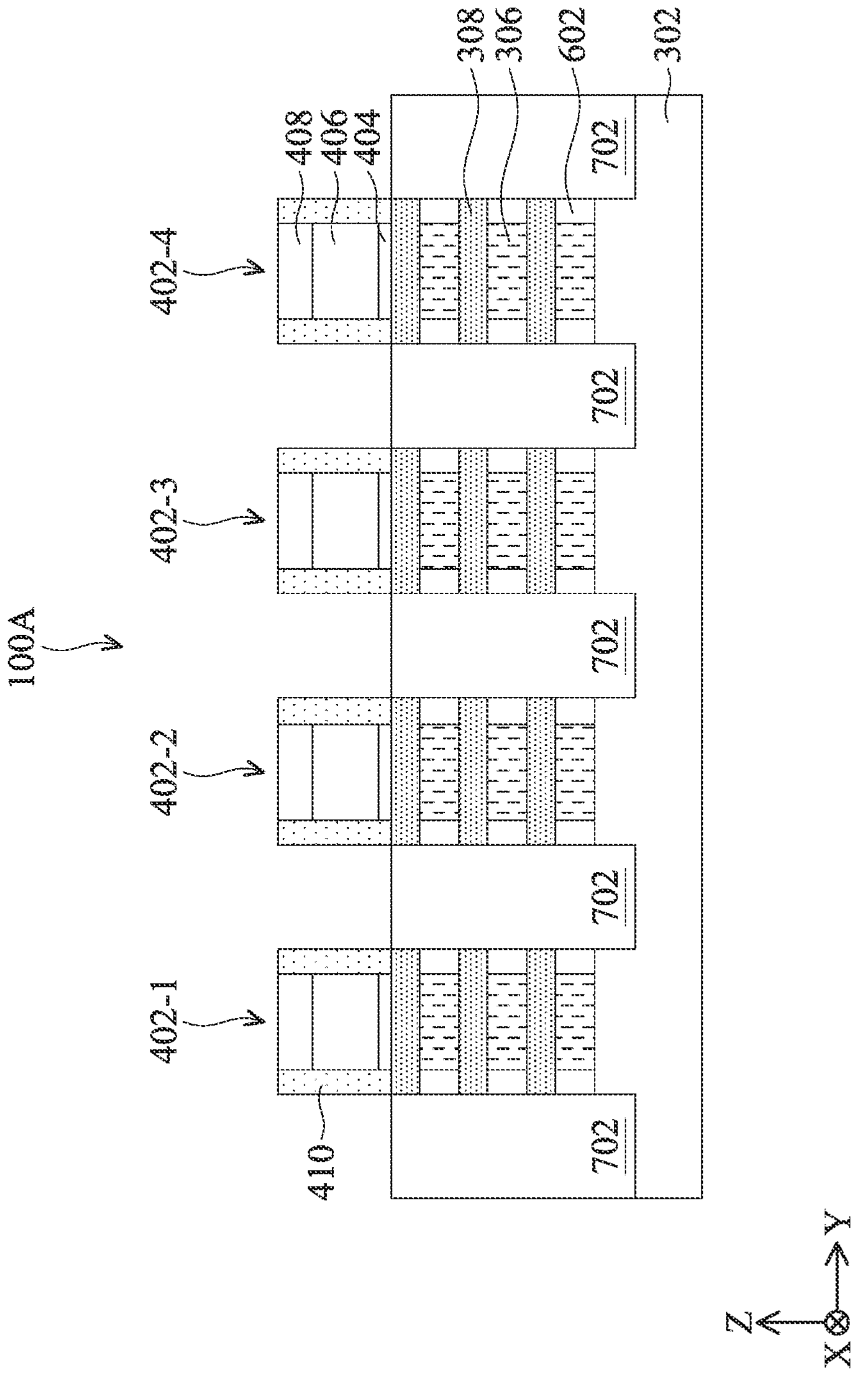

Referring to FIG. 6F, source/drain features 702 are formed in the source/drain trenches 502, so that the source/drain features 702 pass through the semiconductor layers 308 and are in the stacks 312. The source/drain features 702 are in contact with the semiconductor layers 308. In some aspects, the semiconductor layers 308 connect one first source/drain feature 702 to the other second source/drain feature 702. In some embodiments, the source/drain features 702 and the semiconductor layers 308 in the stacks 312 (to be formed as channels or channel layers) may be collectively referred to as active area (active area 202-1 and/or 202-2). One or more epitaxy processes may be employed to grow the source/drain features 702. In other embodiments, the source/drain features 702 may have top surfaces that coplanar with the top surface of the topmost semiconductor layer 308. In other embodiments, the source/drain features 702 may have top surfaces that extend higher than the top surface of the topmost semiconductor layer 308 (e.g., in the third direction). Epitaxy processes can implement CVD deposition techniques (for example, vapor-phase epitaxy (VPE), UHVCVD, LPCVD, and/or PECVD), molecular beam epitaxy, other suitable SEG processes, or combinations thereof. The source/drain features 702 may include any suitable semiconductor materials. For example, the source/drain features 702 in an n-type GAA transistor may include silicon (Si), silicon carbide (SiC), silicon phosphide (SiP), silicon arsenide (SiAs), silicon phosphoric carbide (SiPC), or combinations thereof; while the source/drain features 702 in a p-type GAA transistor may include silicon (Si), silicon germanium (SiGe), germanium (Ge), silicon germanium carbide (SiGeC), or combinations thereof. The source/drain features 702 may be doped in-situ or ex-situ. For example, the epitaxially grown Si source/drain features may be doped with carbon to form silicon:carbon (Si:C) source/drain features, phosphorous to form silicon:phosphor (Si:P) source/drain features, or both carbon and phosphorous to form silicon carbon phosphor (SiCP) source/drain features; and the epitaxially grown SiGe source/drain features may be doped with boron. One or more annealing processes may be performed to activate the dopants in the source/drain features 702. The annealing processes may include rapid thermal annealing (RTA) and/or laser annealing processes.

Figure 6G:
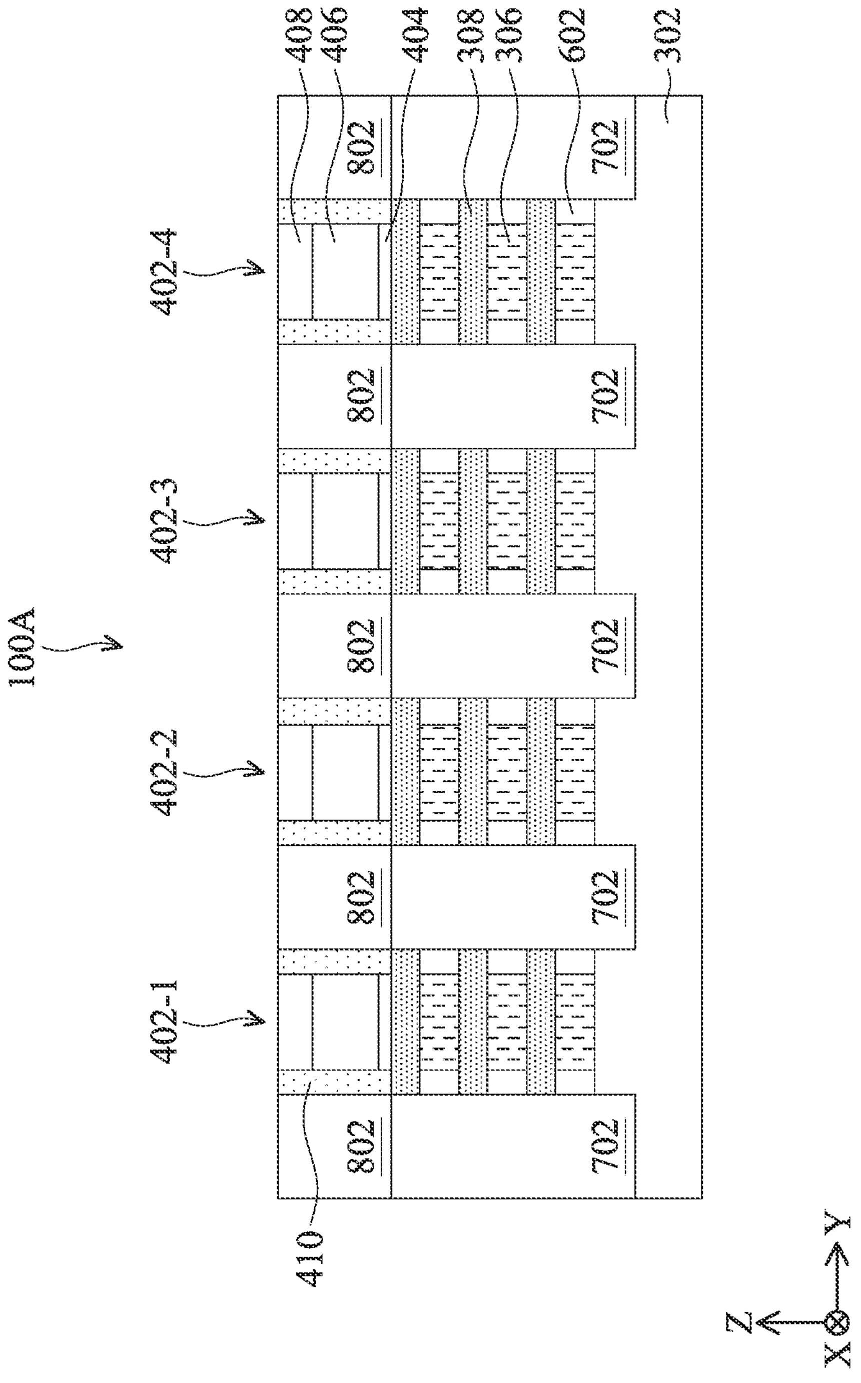

Referring to FIG. 6G, an interlayer dielectric (ILD) layer 802 is formed to fill the space between the gate spacers 410. The ILD layer 802 may comprise tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD layer 802 may be formed by PECVD (plasma enhanced CVD), FCVD (flowable CVD), or other suitable methods. Subsequent to the formation of the ILD layer 802, a CMP process and/or other planarization process is performed on the ILD layer 802 until the top surfaces of the hard mask layers 408 of the dummy gate structures 402 are exposed.

In some embodiments, before the formation of the ILD layer 802, a contact etch stop layer (CESL) may be conformally formed on the sidewalls of the gate spacers 410 and over the top surfaces of the source/drain features 702. The ILD layer 802 is then formed over and between the CESL to fill the space between the CESL. The CESL includes a material that is different than ILD layer 802. The CESL may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods.

In some embodiments, the ILD layer 802 may be recessed to a level below the top surfaces of the dummy gate structures 402 and an ILD protection layer is then formed over the ILD layer 802 to protect the ILD layer 802 from subsequent etching processes. In some other embodiments, the ILD protection layer includes a dielectric material such as $Si_3N_4$, SiCN, SiOCN, SiOC, a metal oxide such as $HrO_2$, $ZrO_2$, hafnium aluminum oxide, and hafnium silicate, or other suitable material, and may be formed by CVD, PVD, ALD, or other suitable methods.

Figures 1, 6H:
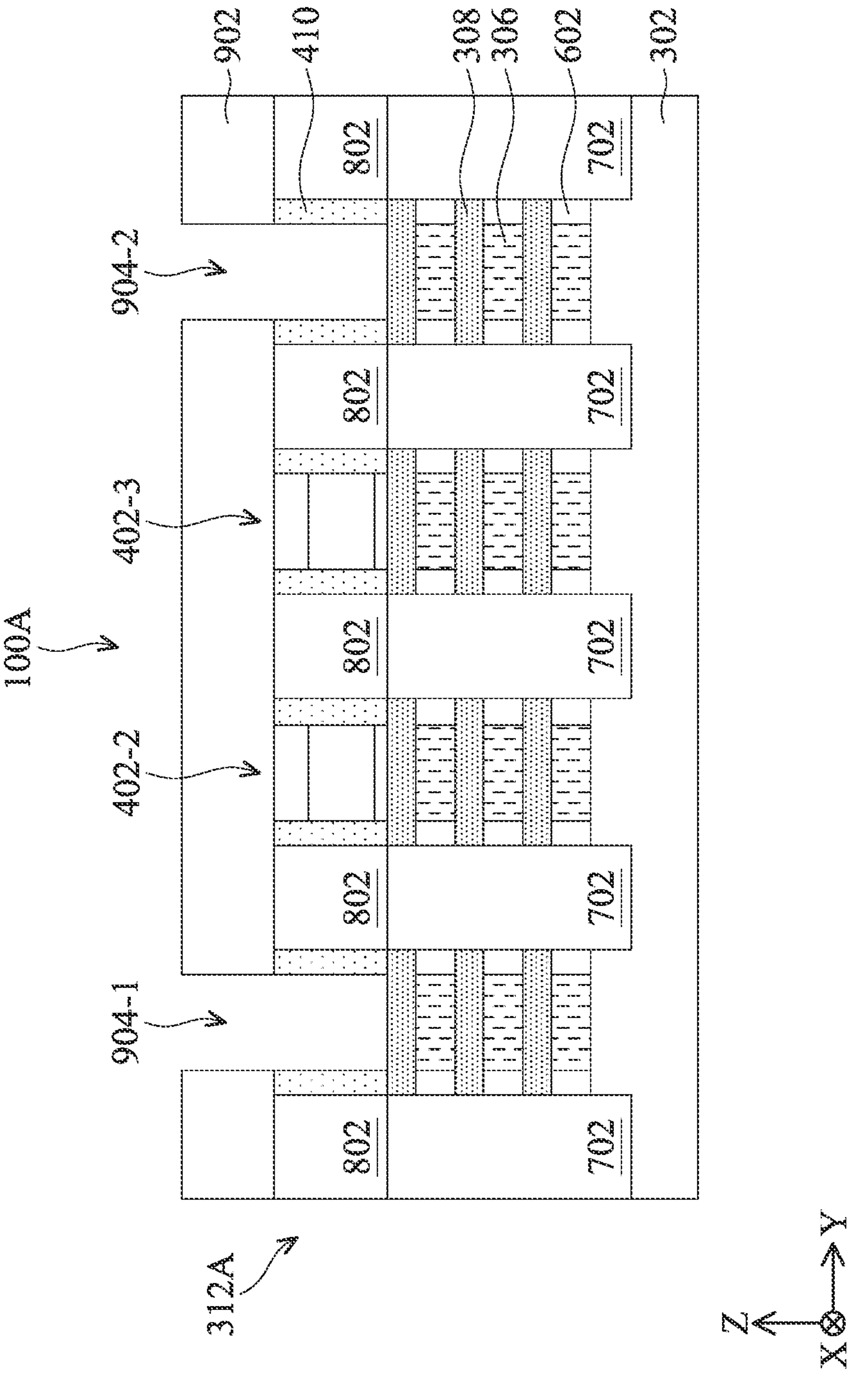
Figures 2, 6H:
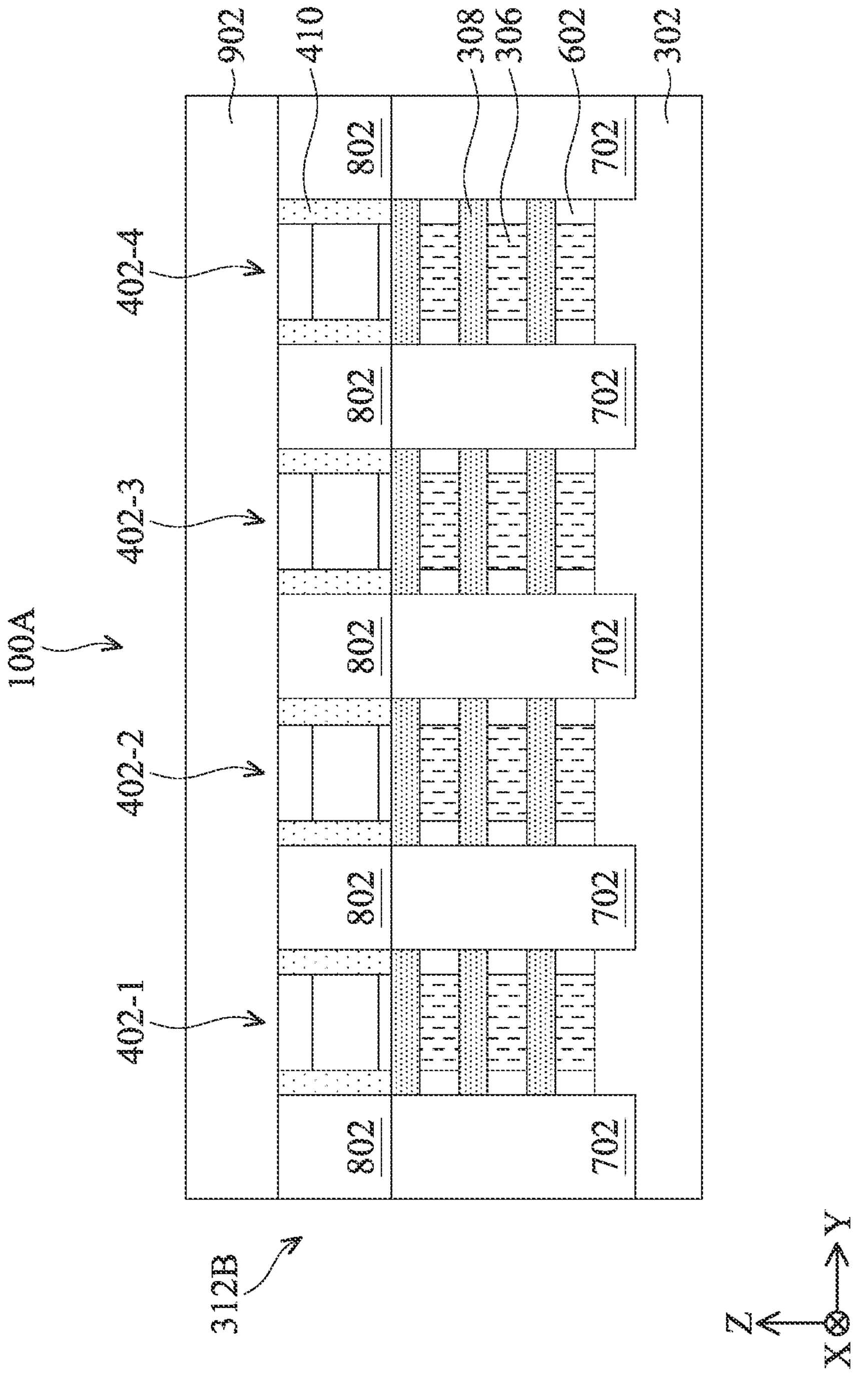

Referring to FIGS. 6H-1 and 6H-2, portions of the dummy gate structures 402 are removed through any suitable lithography and etching processes to form trenches for dielectric structure discussed above. In some embodiments, the lithography process may include forming a hard mask layer 902 over the stacks 312, in which the hard mask layer 902 exposes a portion of the dummy gate structure 402-1 and a portion of the dummy gate structure 402-4 over the stack 312A, as shown in FIG. 6H-1. Portions of dummy gate structure 402 over the stack 312B are covered by the hard mask layer 902 for protecting the stack 312B from subsequent etching processes, as shown in FIG. 6H-2. In some embodiments, the hard mask layer 902 may include photoresist materials or hard mask materials. In some embodiments, each of the hard mask layer 902 may include multiple layers, such as a silicon nitride layer and a silicon oxide layer. Then, the exposed portions of the dummy gate structures 402-1 and 402-4 are removed (e.g., by etching process) through the hard mask layer 902. The removal of the exposed portions of the dummy gate structures 402-1 and 402-4 creates trenches 904-1 and 904-2 (may be collectively referred to as trenches 904). The trenches 904 expose the top surfaces of the topmost semiconductor layers 108.

Figures 1, 6I:
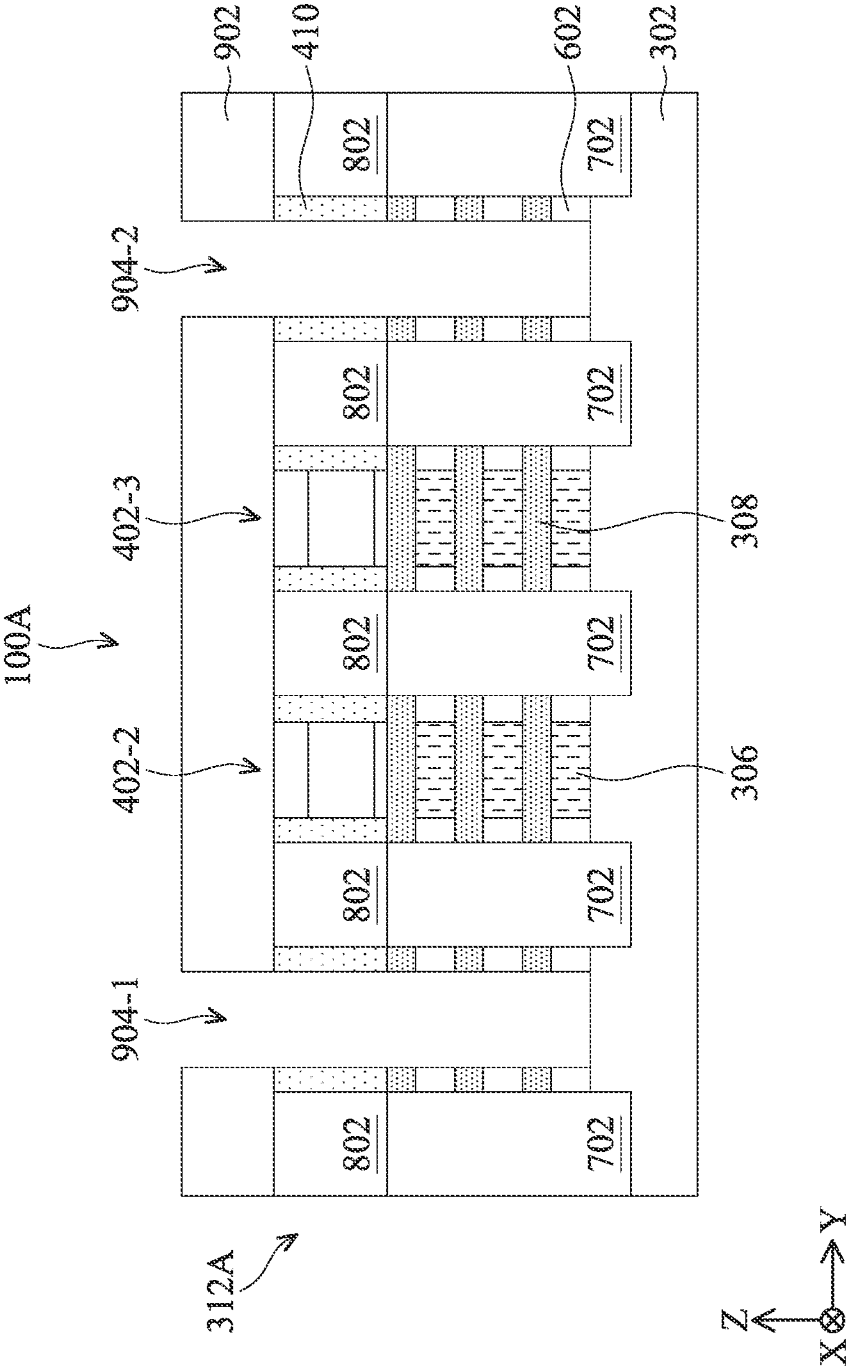
Figures 2, 6I:
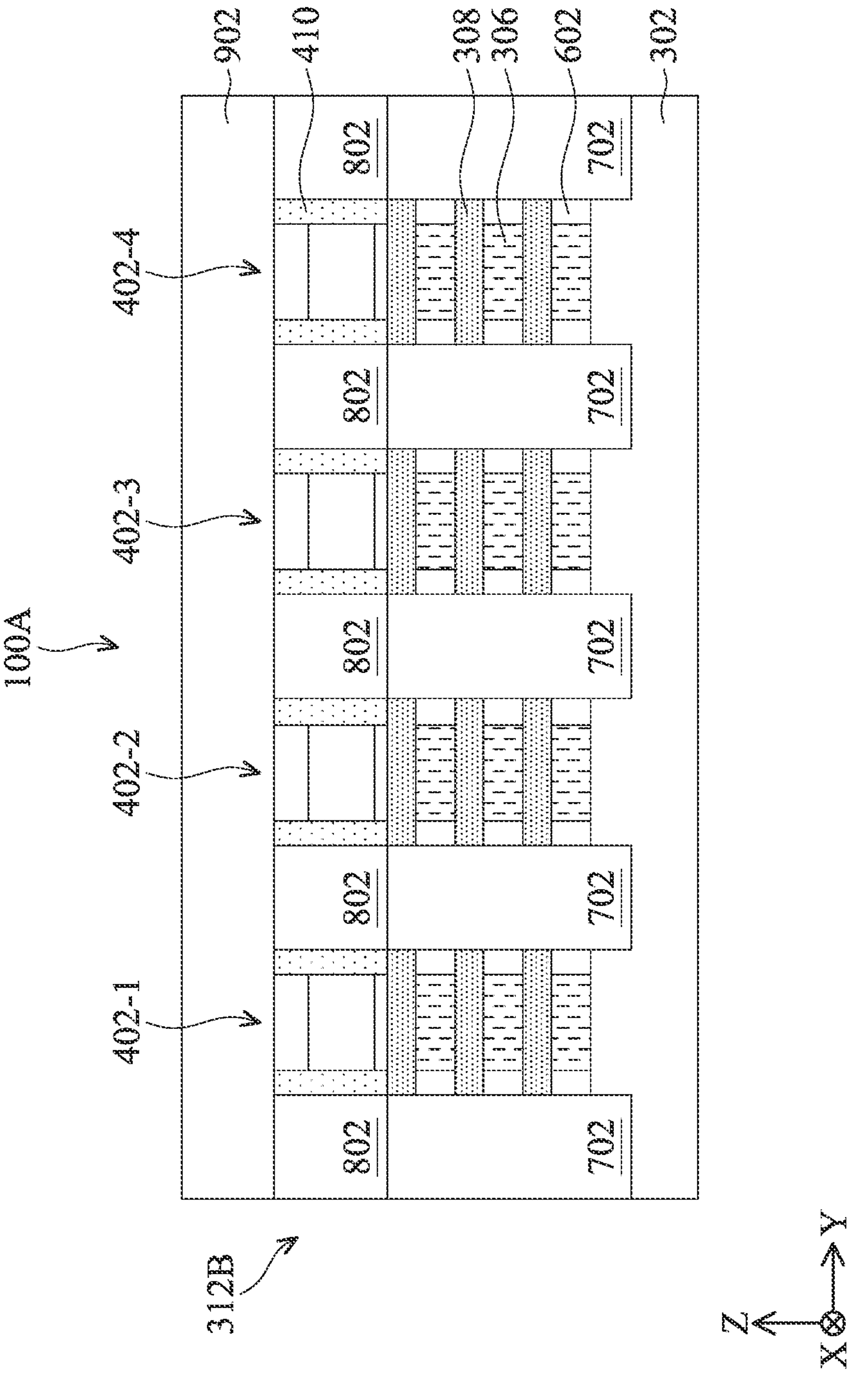

Referring to FIGS. 6I-1 and 6I-2, the semiconductor layers 306 and 308 in the trenches 904-1 and 904-2 are removed through an etching process. The etching process may include dry etching process, wet etching process, reactive ion etching (RIE) process, and/or other suitable etching processes. After the etching process, top surfaces of the substrate 302 in the trenches 904-1 and 904-2 are exposed, as shown in FIG. 6I-1. In some embodiments, portions of the substrate 302 in the trenches 904-1 and 904-2 may also be removed during the etching process. As shown in FIG. 6I-2, the dummy gate structures 402-1 to 402-4 over the stack 312B and the semiconductor layers 306 and 308 in the stack 312B are protected by the hard mask layer 902 from the etching process. Some portions of the semiconductor layers 308 below the gate spacers 410 remain between the inner spacers 602.

Figures 1, 6J:
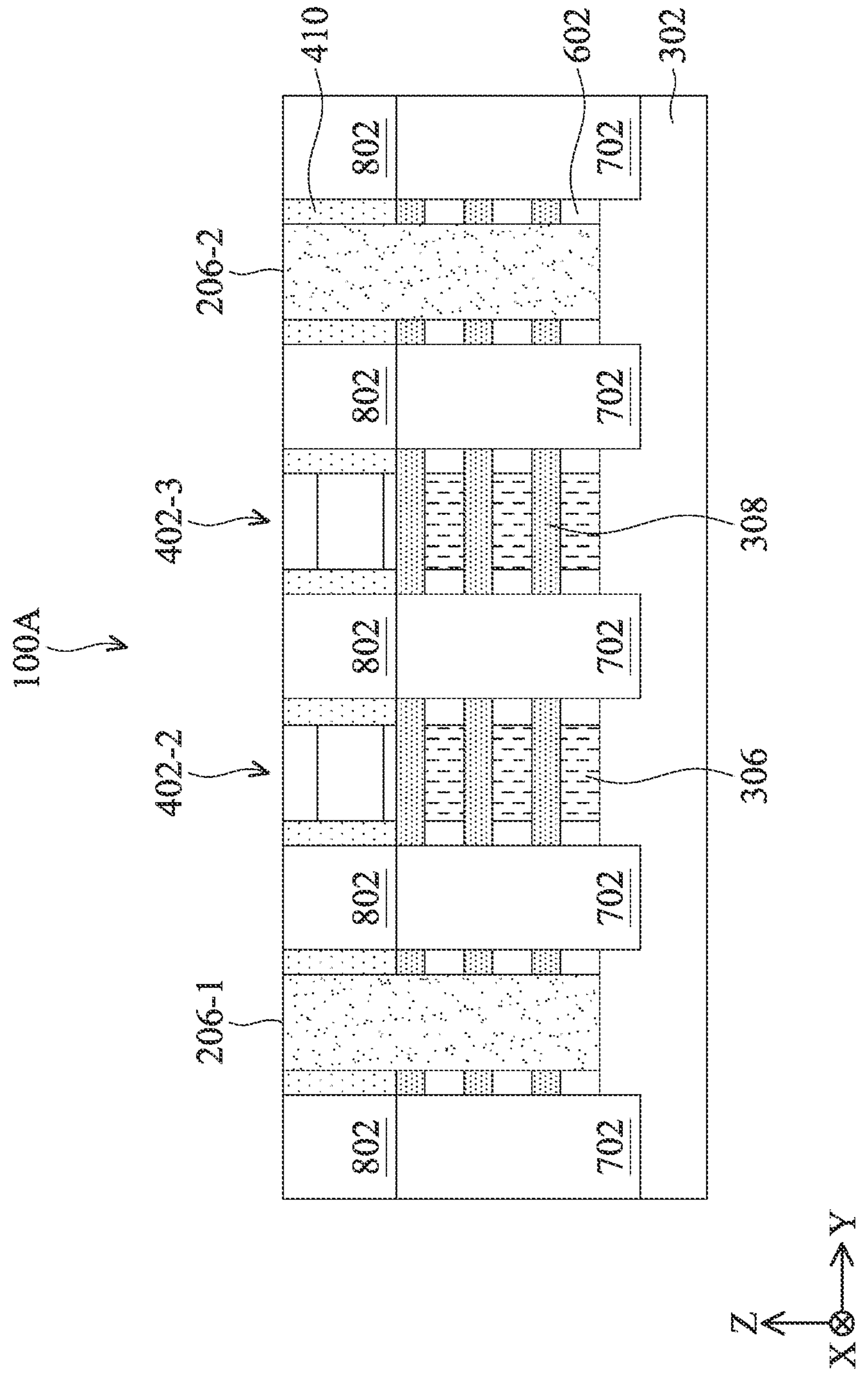
Figures 2, 6J:
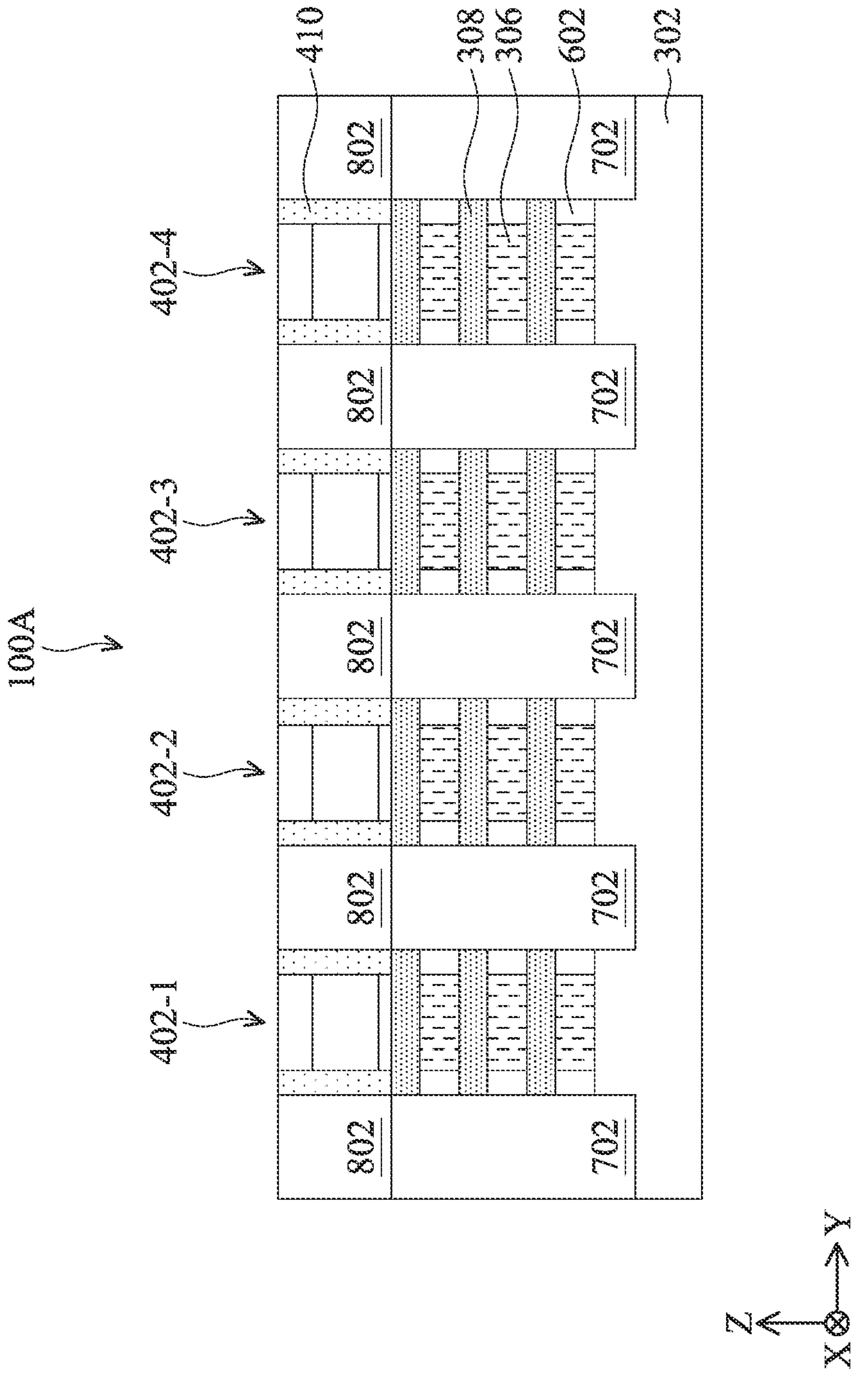

Referring to FIGS. 6J-1 and 6J-2, a dielectric material is formed to fill the trenches 904-1 and 904-2 to form the dielectric structures 206-1 and 206-2 discussed above. Specifically, the dielectric material is formed over the substrate 302, between the gate spacers 410, between the remaining semiconductor layers 308, and between the inner spacers 602. Top surfaces of the dielectric structures 206-1 and 206-2 and top surfaces of the ILD layer 802 are substantially coplanar. The dielectric material of the dielectric structures 206-1 and 206-2 may be different than the material of the ILD layer 802. In some embodiments, the dielectric material of the dielectric structures 206-1 and 206-2 includes a dielectric material such as $SiO_2$, $Si_3N_4$, SiON, SiOCN, SiOC, SiCN, a metal oxide such as $HrO_2$, $ZrO_2$, hafnium aluminum oxide, and hafnium silicate, or other suitable material, and may be formed by CVD, PVD, ALD, or other suitable methods. The above processes for forming the dielectric structures 206-1 and 206-2 may be referred to as continuous poly on diffusion edge (CPODE) process. After the formation of the dielectric structures 206-1 and 206-2, the hard mask layer 902 is removed.

Figures 1, 6K:
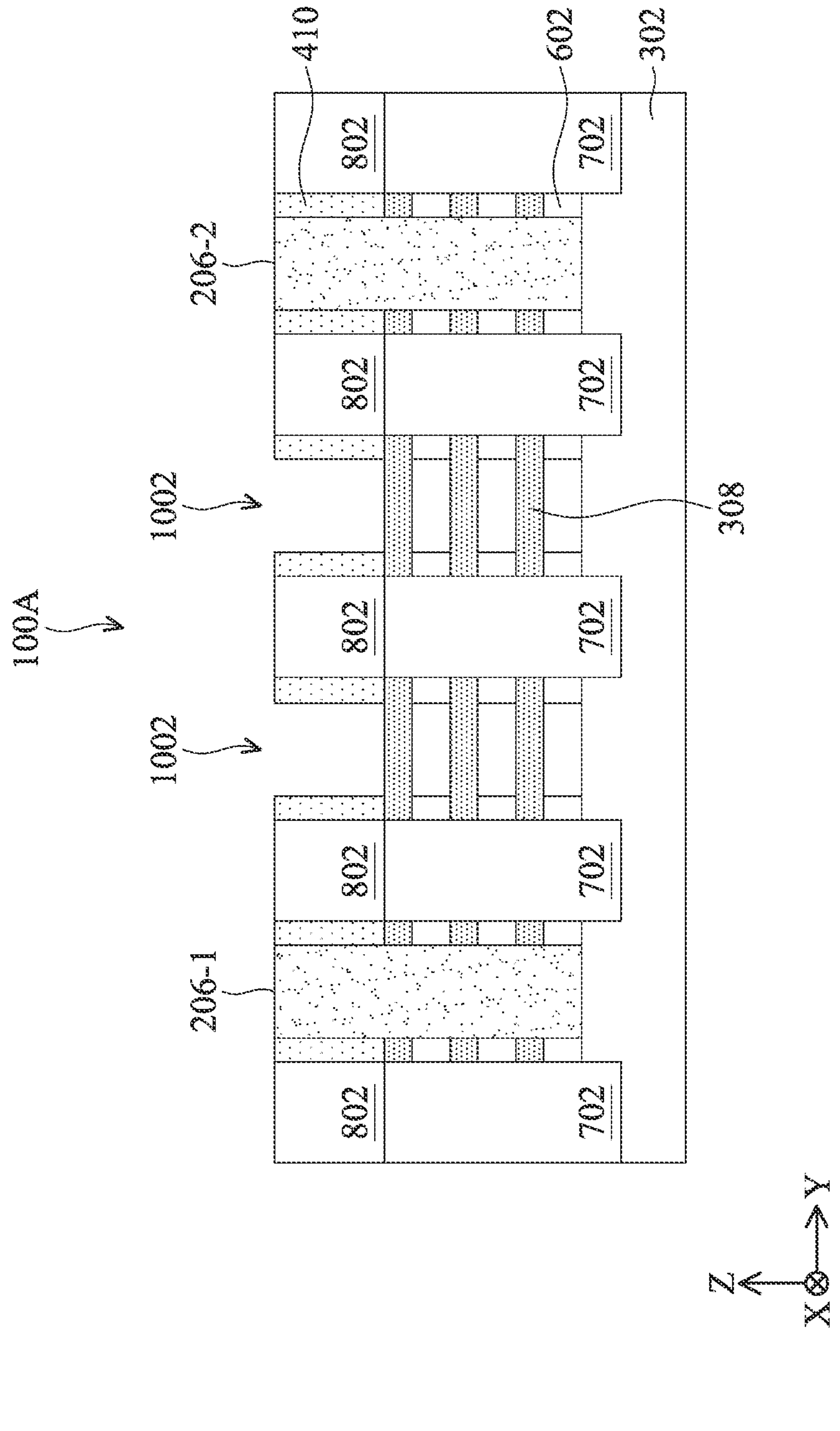
Figures 2, 6K:
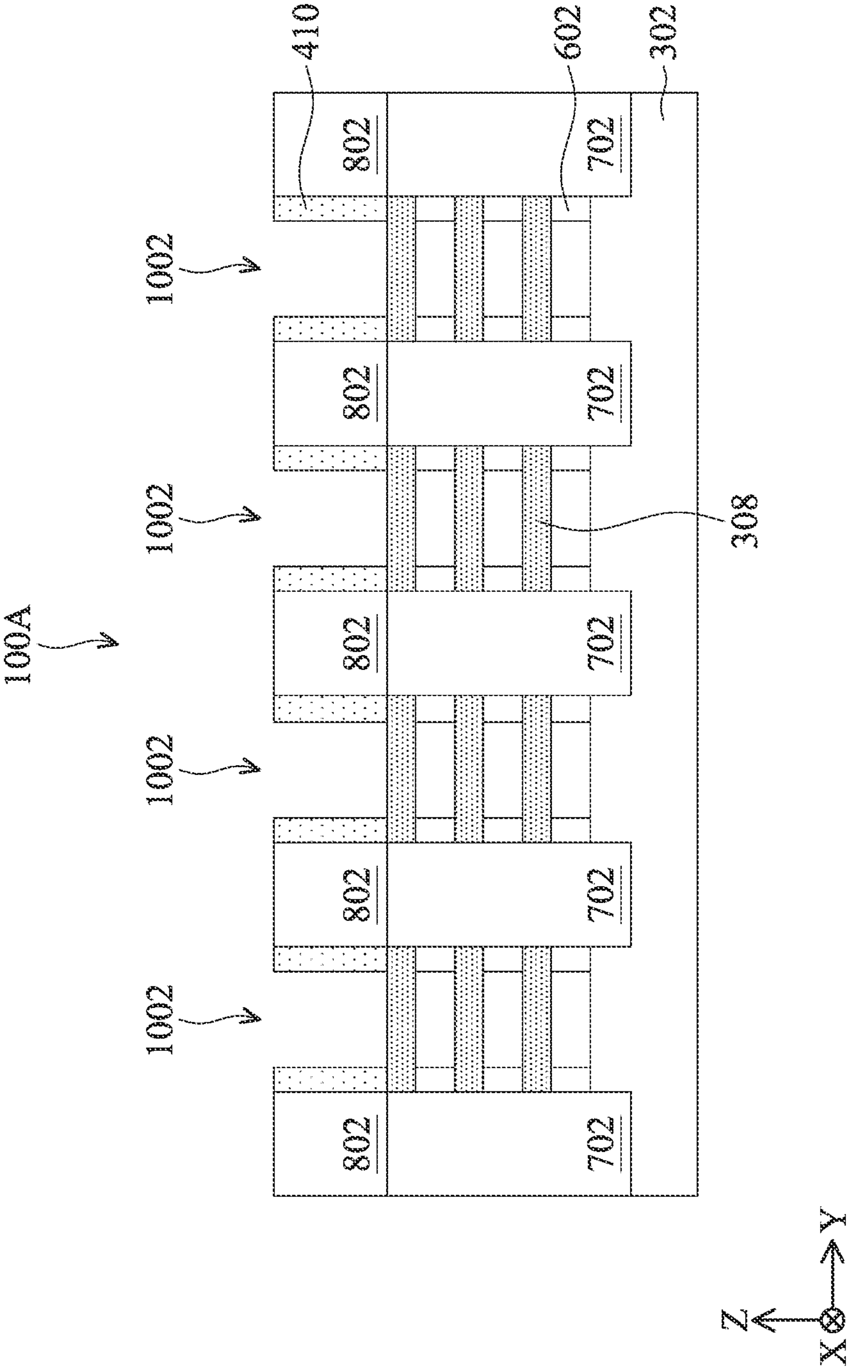

Referring to FIGS. 6K-1 and 6K-2, the dummy gate structures 402-2 and 402-3 and the remaining portions of the dummy gate structures 402-1 and 402-4 over the stacks 312B are selectively removed through any suitable lithography and etching processes. In some embodiments, the lithography process may include forming a photoresist layer (resist), exposing the resist to a pattern, performing a post-exposure bake process, and developing the resist to form a masking element, which exposes a region including the dummy gate structures 402. Then, the dummy gate structures 402 are selectively etched through the masking element. Etch selectivity may be achieved by selecting the appropriate etching chemicals, and the dummy gate structures 402 may be removed without substantially affecting the gate spacers 410, the inner spacers 602, and the substrate 302. The removal of the dummy gate structures 402 creates gate trenches 1002. The gate trenches 1002 expose the top surfaces of the topmost semiconductor layers 308 underlies the dummy gate structures 402.

Still referring to FIGS. 6K-1 and 6K-2, the semiconductor layers 308 of the stacks 312 are selectively removed through the gate trenches 1002, using a wet or dry etching process for example, so that the semiconductor layers 308 are exposed in the gate trenches 1002 to form nanostructures stacked over each other. Such a process may also be referred to as a wire release process, a nanowire release process, a nanosheet release process, a nanowire formation process, a nanosheet formation process, or a wire formation process. In some embodiments, the removal of the semiconductor layers 106 causes the exposed semiconductor layers 308 to be spaced apart from each other in the vertical direction (e.g., in the third direction). The exposed semiconductor layers 308 extend longitudinally in the horizontal direction (e.g., in the first direction), and each connects one source/drain feature 702 to another source/drain feature 702. The semiconductor layers 308 are also formed as channels or channel layers of transistors in the resultant SRAM cell 100A.

Figures 1, 6L:
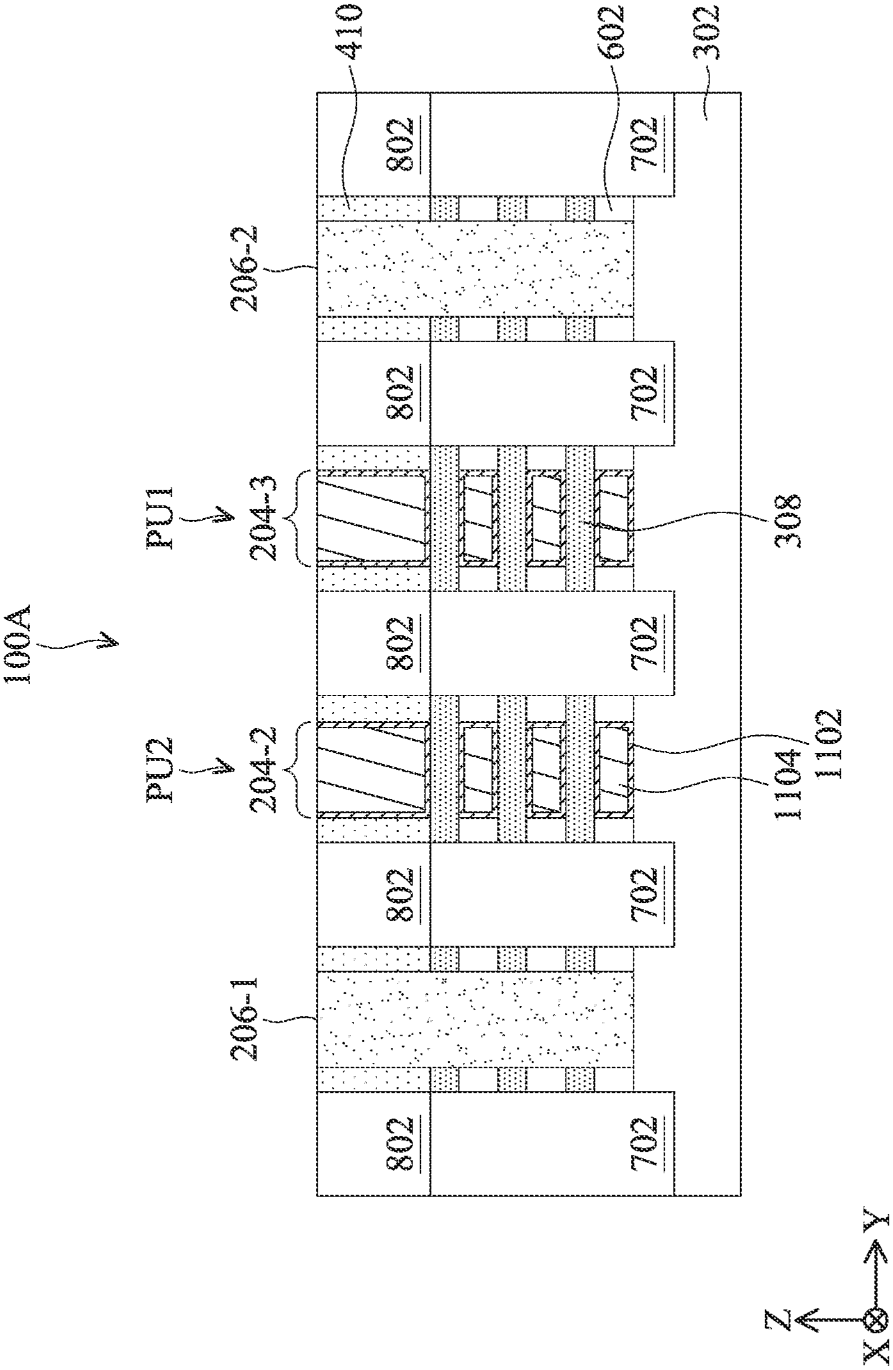
Figures 2, 6L:
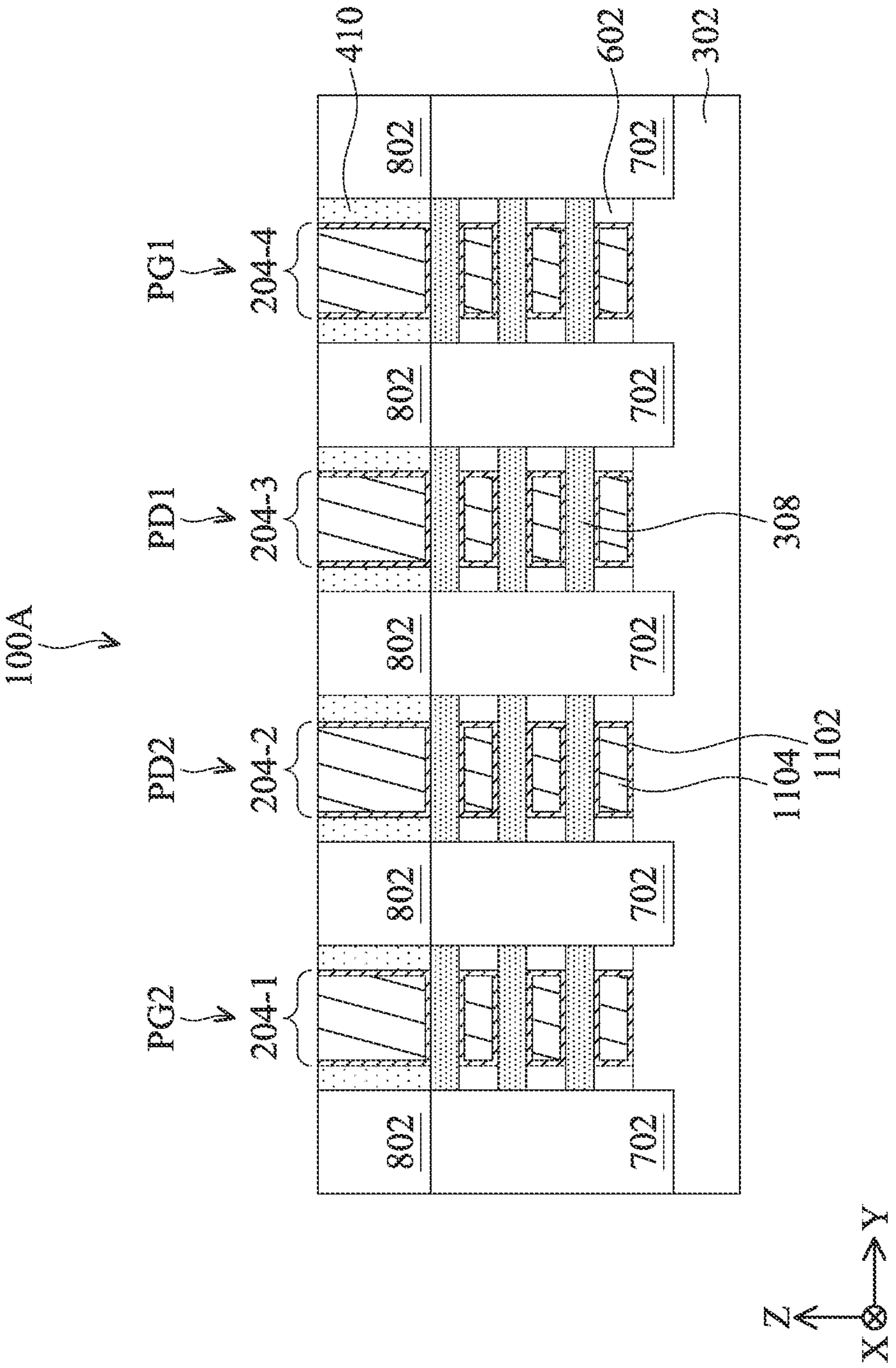

Referring to FIGS. 6L-1 and 6L-2, the gate structures 204-1 to 204-4 discussed above are formed in the gate trenches 1002. The gate structures 204-1 to 204-4 each includes a gate dielectric layer 1102 and a gate electrode 1104 over the gate dielectric layer 1102. In some embodiments, the gate dielectric layers 1102 are formed to wrap around the semiconductor layers 308. Additionally, the gate dielectric layers 1102 are also formed on sidewalls of the inner spacers 602 and the gate spacers 410. The gate dielectric layers 1102 may include a dielectric material having a dielectric constant greater than a dielectric constant of $SiO_2$, which is approximately 3.9. For example, the gate dielectric layers 1102 may include hafnium oxide ($HfO_2$), which has a dielectric constant in a range from about 18 to about 40. Alternatively, the gate dielectric layers 1102 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, HfTaO, HfTiO, (Ba,Sr)$TiO_3$ (BST), $Al_2O_3$, $Si_3N_4$, oxynitrides (SiON), combinations thereof, or other suitable material. The gate dielectric layers 1102 may be formed by ALD, PVD, CVD, oxidation, and/or other suitable methods.

In some embodiments, interfacial layer may be formed to wrap around the exposed semiconductor layers 308 before the formation of the gate dielectric layers 1102, so that the gate dielectric layers 1102 are separated from semiconductor layers 308 by the interfacial layer. In some embodiments, the interfacial layer may include a dielectric material such as silicon oxide ($SiO_2$), HfSiO, or silicon oxynitride (SiON). The interfacial layer may be formed by chemical oxidation, thermal oxidation, ALD, CVD, and/or other suitable method.

The gate electrodes 1104 are then formed to fill the remaining spaces of the gate trenches 1002, and over the gate dielectric layers 1102 in such a way that the gate electrodes 1104 each wraps around the semiconductor layers 308, the gate dielectric layer 1102, and the interfacial layers (if present). The gate electrode 1104, the gate dielectric layer 1102, and the interfacial layers (if present) may be collectively called as the gate structure 204 wrapping around the semiconductor layers 308. The gate electrodes 1104 each may include a single layer or alternatively a multi-layer structure. In some embodiments, the gate electrode 1104 may include a capping layer, a barrier layer, an n-type work function metal layer, a p-type work function metal layer, and a fill material (not shown).

The capping layer may be formed adjacent to the gate dielectric layer 1102 and may be formed from a metallic material such as TaN, Ti, TiAlN, TiAl, Pt, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The metallic material may be deposited using a deposition process such as ALD, CVD, or the like, although any suitable deposition process may be used.

The barrier layer may be formed adjacent the capping layer, and may be formed of a material different from the capping layer. For example, the barrier layer may be formed of a material such as one or more layers of a metallic material such as TiN, TaN, Ti, TiAlN, TiAl, Pt, TaC, TaCN, TaSiN, Mn, Zr, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be deposited using a deposition process such as atomic layer deposition, chemical vapor deposition, or the like, although any suitable deposition process may be used.

The n-type work function metal layer may be formed adjacent to the barrier layer. In some embodiments, the n-type work function metal layer is a material such as W, Cu, AlCu, TiAlC, TiAlN, TiAl, Pt, Ti, TiN, Ta, TaN, Co, Ni, Ag, Al, TaAl, TaAlC, TaC, TaCN, TaSiN, Mn, Zr, other suitable n-type work function materials, or combinations thereof. For example, the n-type work function metal layer may be deposited utilizing ALD, CVD, or the like. However, any suitable materials and processes may be utilized to form the n-type work function metal layer.

The p-type work function metal layer may be formed adjacent to the n-type work function metal layer. In some embodiments, the p-type work function metal layer may be formed from a metallic material such as W, Al, Cu, TiN, Ti, TiAlN, TiAl, Pt, Ta, TaN, Co, Ni, TaC, TaCN, TaSiN, $TaSi_2$, $NiSi_2$, Mn, Zr, $ZrSi_2$, Ru, AlCu, Mo, $MoSi_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the p-type work function metal layer may be deposited using a deposition process such as ALD, CVD, or the like, although any suitable deposition process may be used.

As shown in FIGS. 6L-1 and 6L-2, after the formation of the gate structures 204-1 to 204-4, the formation of the pass-gate transistors PG1 and PG2, the pull-down transistors PD1 and PD2, and the pull-up transistors PU1 and PU2 of the SRAM cell discussed above are completed.

Figures 1, 6M:
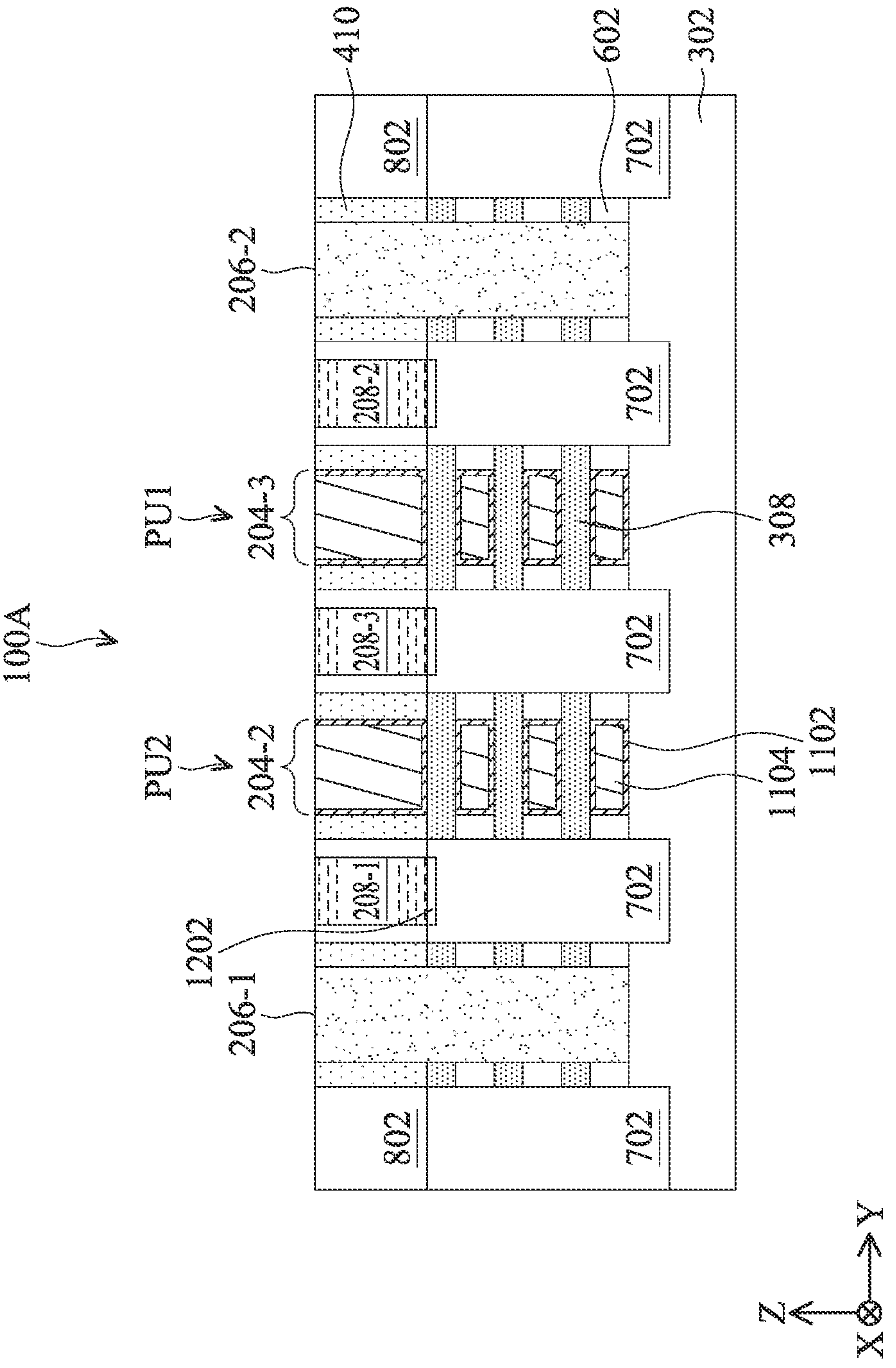
Figures 2, 6M:
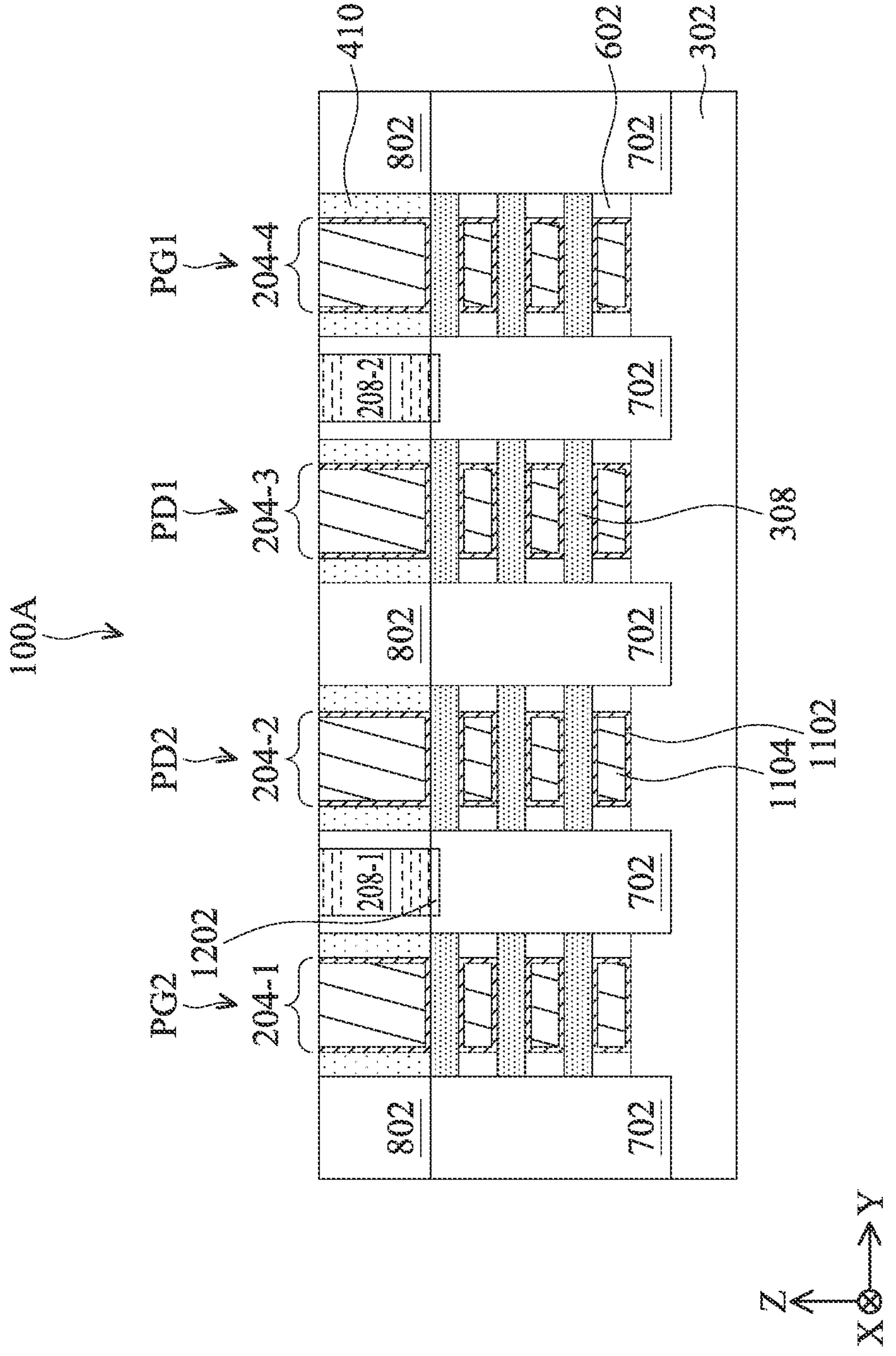
Figures 1, 6N:
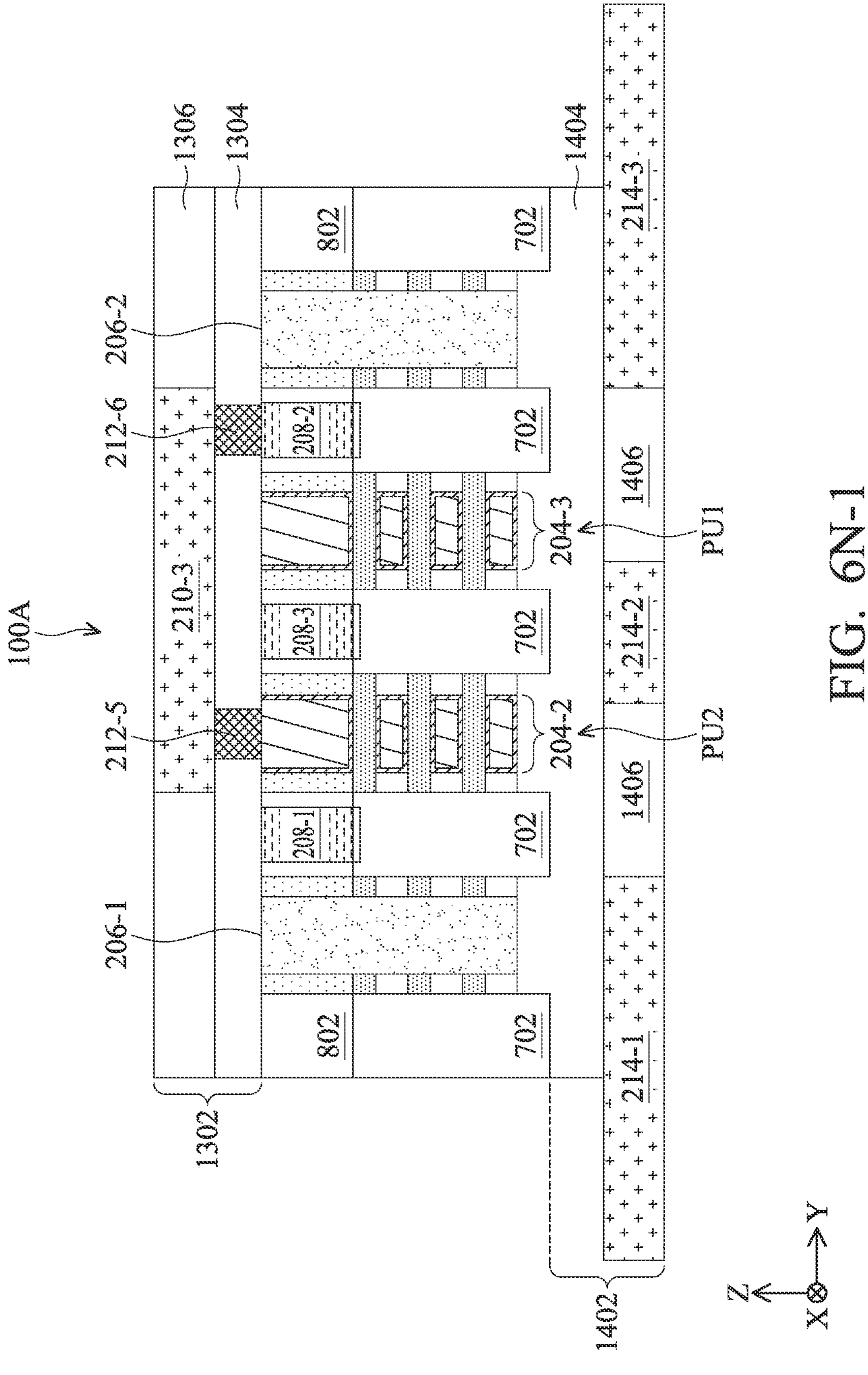
Figures 2, 6N:
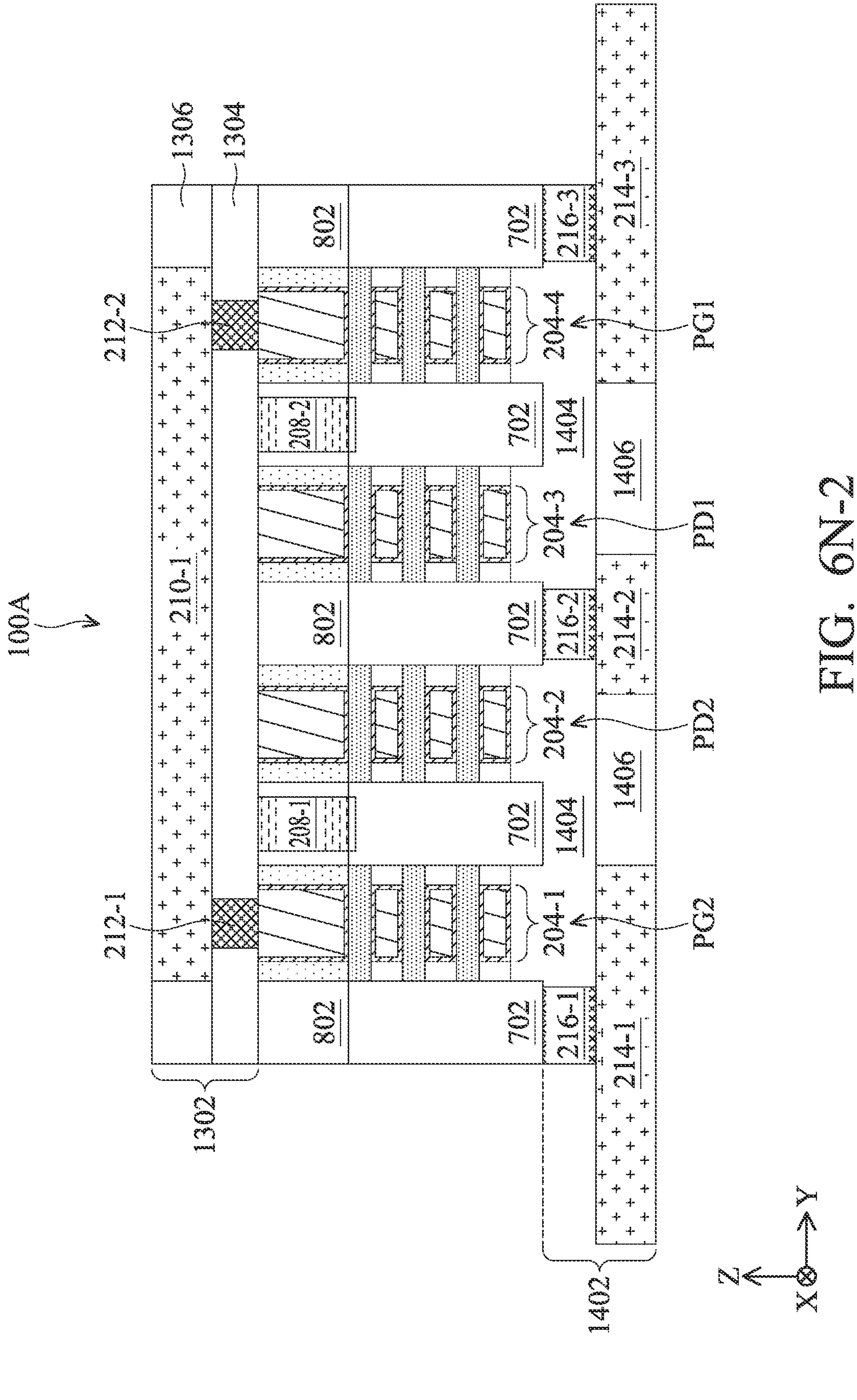
Figures 3, 6N:
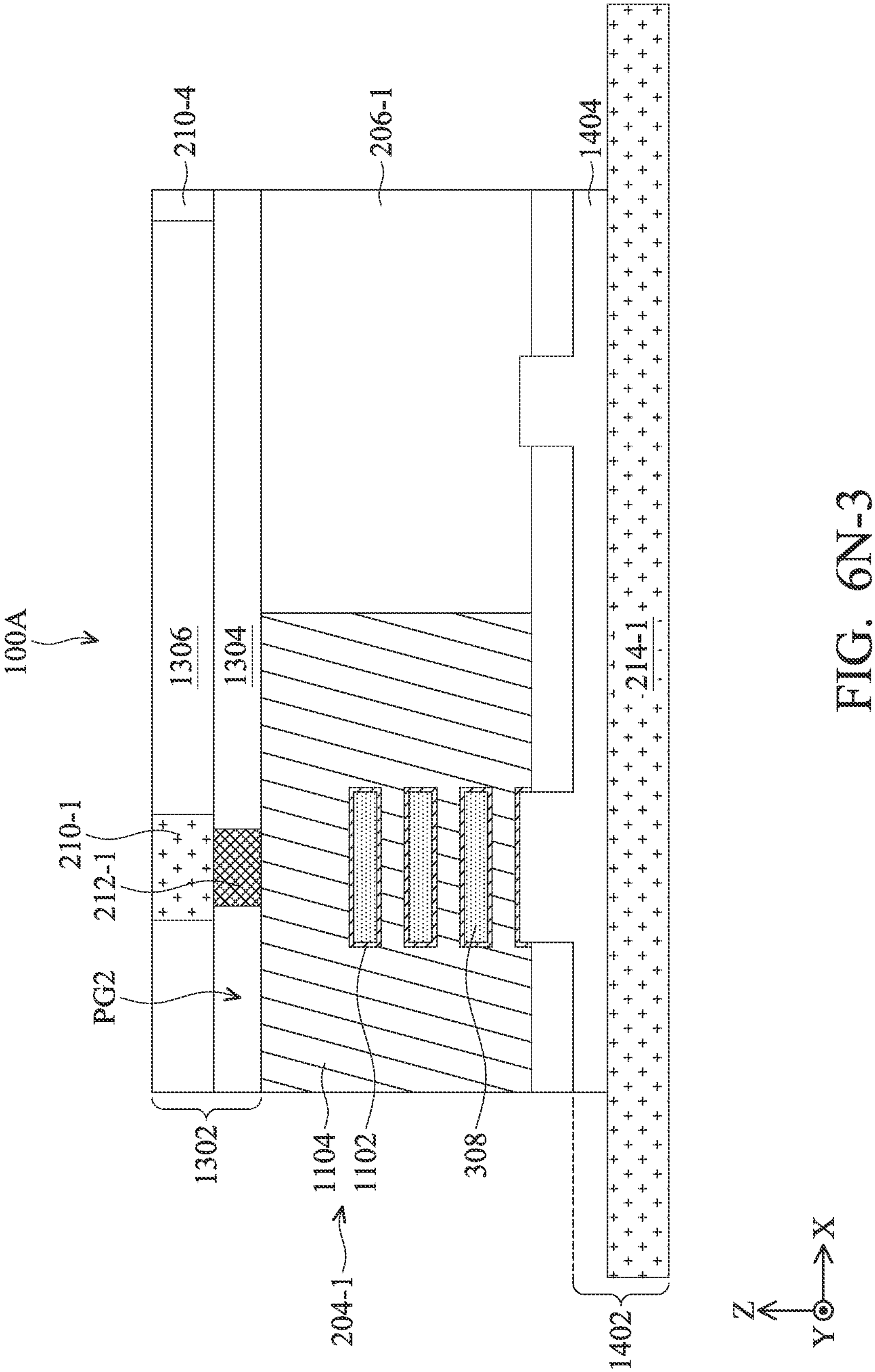

Referring to FIGS. 6M-1 and 6M-2, the source/drain contacts 208-1, 208-2, and 208-3 discussed above are formed in the ILD layer 802. As shown in FIGS. 6M-1 and 6M-2, the source/drain contact 208-1 electrically couples to the source/drain feature 702 of the pass-gate transistor PG2 and the pull-down transistor PD2 and electrically couples to the source/drain feature 702 of the pull-up transistor PU2; the source/drain contact 208-2 electrically couples to the source/drain feature 702 of the pass-gate transistor PG1 and the pull-down transistor PD1 and electrically couples to the source/drain feature 702 of the pull-up transistor PU1; and the source/drain contact 208-3 electrically couples to the source/drain feature 702 of the pull-up transistors PU1 and PU2. The source/drain contacts 208-1 to 208-3 may each include a conductive material such as Al, Cu, W, Co, Ti, Ta, Ru, TiN, TiAl, TiAlN, TaN, TaC, combinations of these, or the like, although any suitable material may be deposited using a deposition process such as sputtering, CVD, electroplating, electroless plating, or the like. In some embodiments, additional features are formed in between the source/drain features 702 and the source/drain contacts 208, such as silicide features 1202. The silicide features 1202 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds in order to reduce the Schottky barrier height of the source/drain contacts 208.

Referring to FIGS. 6N-1, 6N-2, and 6N-3, a frontside interlayer connection 1302 and a backside interlayer connection 1402 are respectively formed at the frontside and the backside of the SRAM cell 100A. The frontside interlayer connection 1302 includes dielectric layers 1304 and 1306, the metal lines 210 discussed above, and the vias 212 discussed above (FIGS. 6N-1, 6N-2, and 6N-3 show the metal lines 210-1 and 210-3, and the vias 212-1, 212-2, 212-5, and 212-6). The backside interlayer connection 1402 includes dielectric layers 1404 and 1406, the metal lines 214 discussed above, and the backside vias 216 discussed above. Further, as discussed above, the dielectric structure 206-1 is in contact with the gate structure 204-1 of the pass-gate transistor PG2, as shown in FIG. 6N-3. It is noted that the substrate 302 is removed and replaced into the dielectric layer 1404 for the backside interlayer connection 1402.

The dielectric layers 1304, 1306, 1404, and 1406 may include an etch stop layer, an inter-layer dielectric layer, and other dielectric layers. The etch stop layer may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The inter-layer dielectric layer may comprise tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), and/or other suitable dielectric materials. The inter-layer dielectric layer may be formed by PECVD (plasma enhanced CVD), FCVD (flowable CVD), or other suitable methods.

In some embodiments, each of the vias (including the vias 212-1 to 212-7 and the backside vias 216-1 to 216-3) may include a barrier layer and a metal fill layer over the barrier layer. The barrier layer functions to prevent metal materials of the metal fill layer from diffusing into nearby dielectric layers. The barrier layer may include titanium (Ti), tantalum (Ta), tungsten (W), cobalt (Co), ruthenium (Ru), or a nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes.

In some embodiments, each of the metal lines (including the metal lines 210-1 to 210-4 and the metal lines 214-1 to 214-3) may be formed using a damascene process, a dual-damascene process, a metal patterning process, or other suitable processes. The metal lines may include tungsten (W), cobalt (Co), molybdenum (Mo), ruthenium (Ru), copper (Cu), aluminum (Al), titanium (Ti), tantalum (Ta), or other metals, and may be deposited by CVD, PVD, ALD, plating, or other suitable processes.

Figure 7:
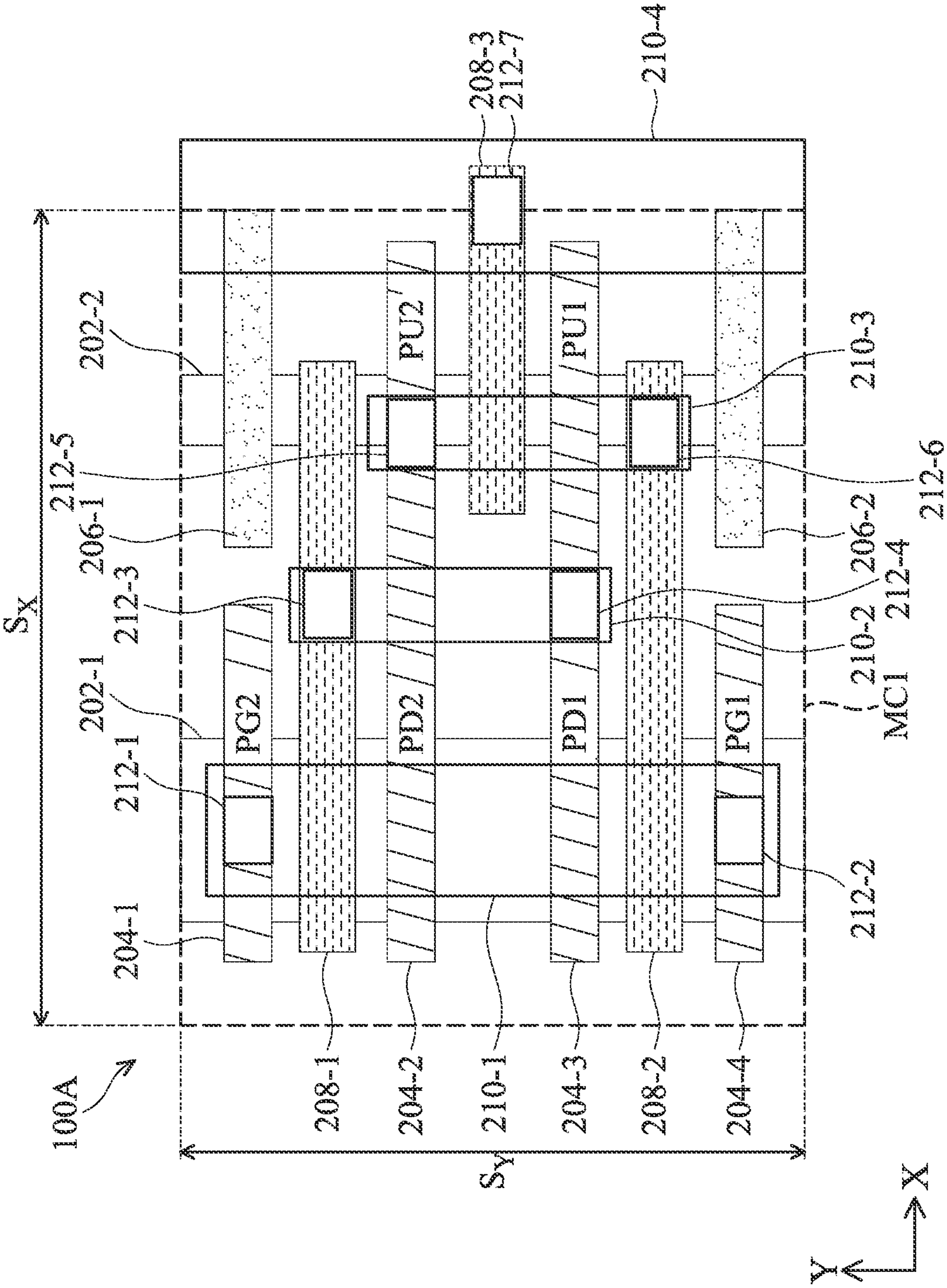
FIG. 7 shows a layout of an SRAM cell of a memory device in the memory region of FIG. 1, in accordance with some alternative embodiments.

FIG. 7 shows a layout (or a top view) of the SRAM cell 100A of the memory device in the memory region 20 of FIG. 1, in accordance with some alternative embodiments. The layout in these embodiments are similar to the one shown in FIG. 4. Differences among them are the gate structures 204-1 and 204-4 and the dielectric structures 206-1 and 206-2. As shown in FIG. 7, the dielectric structure 206-1 is separated from the gate structure 204-1 in the second direction and the dielectric structure 206-2 is separated from the gate structure 204-4 in the second direction.

Figure 8:
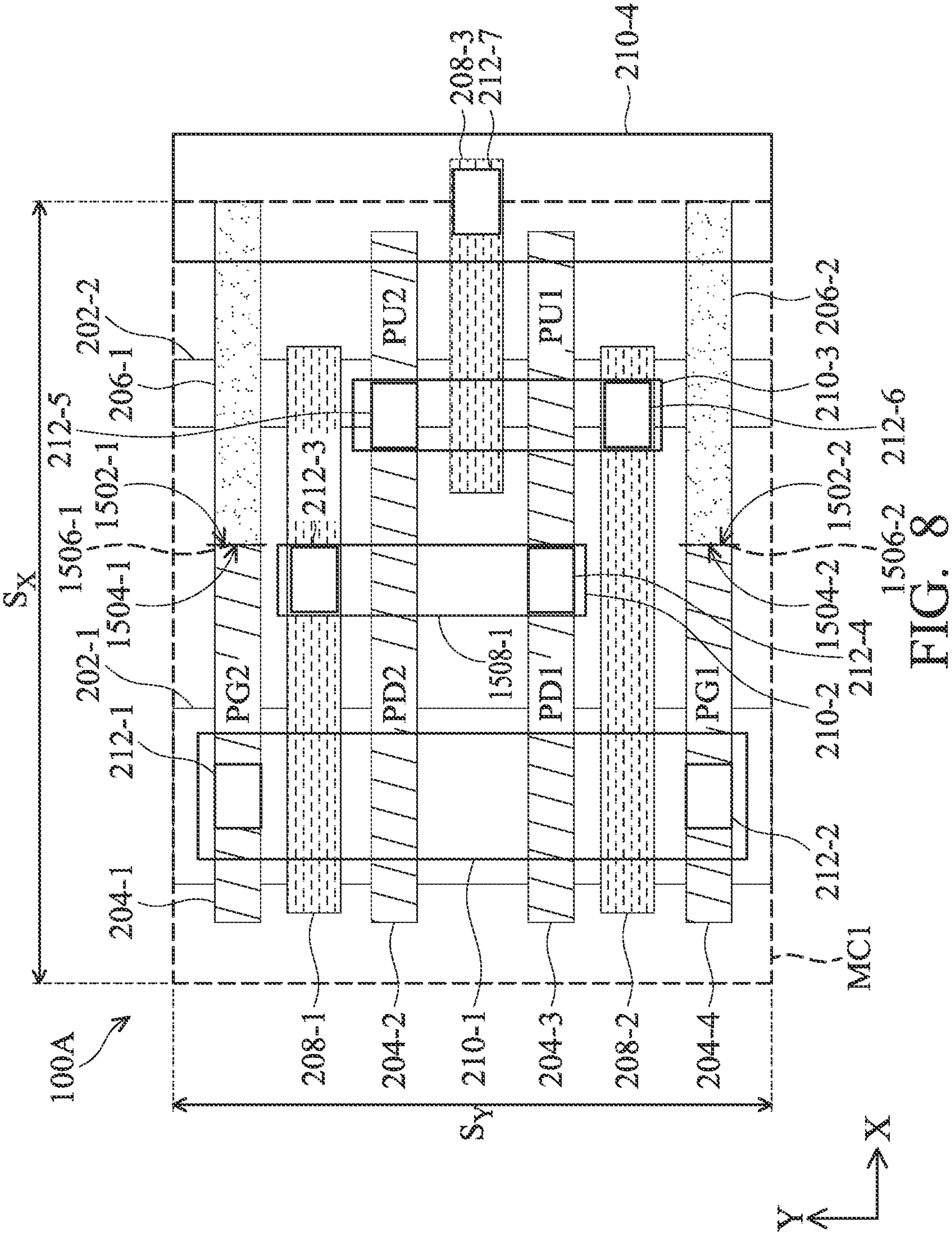
FIGS. 8 and 9 show layouts of an SRAM cell of a memory device in the memory region of FIG. 1, in accordance with some alternative embodiments.
Figure 9:
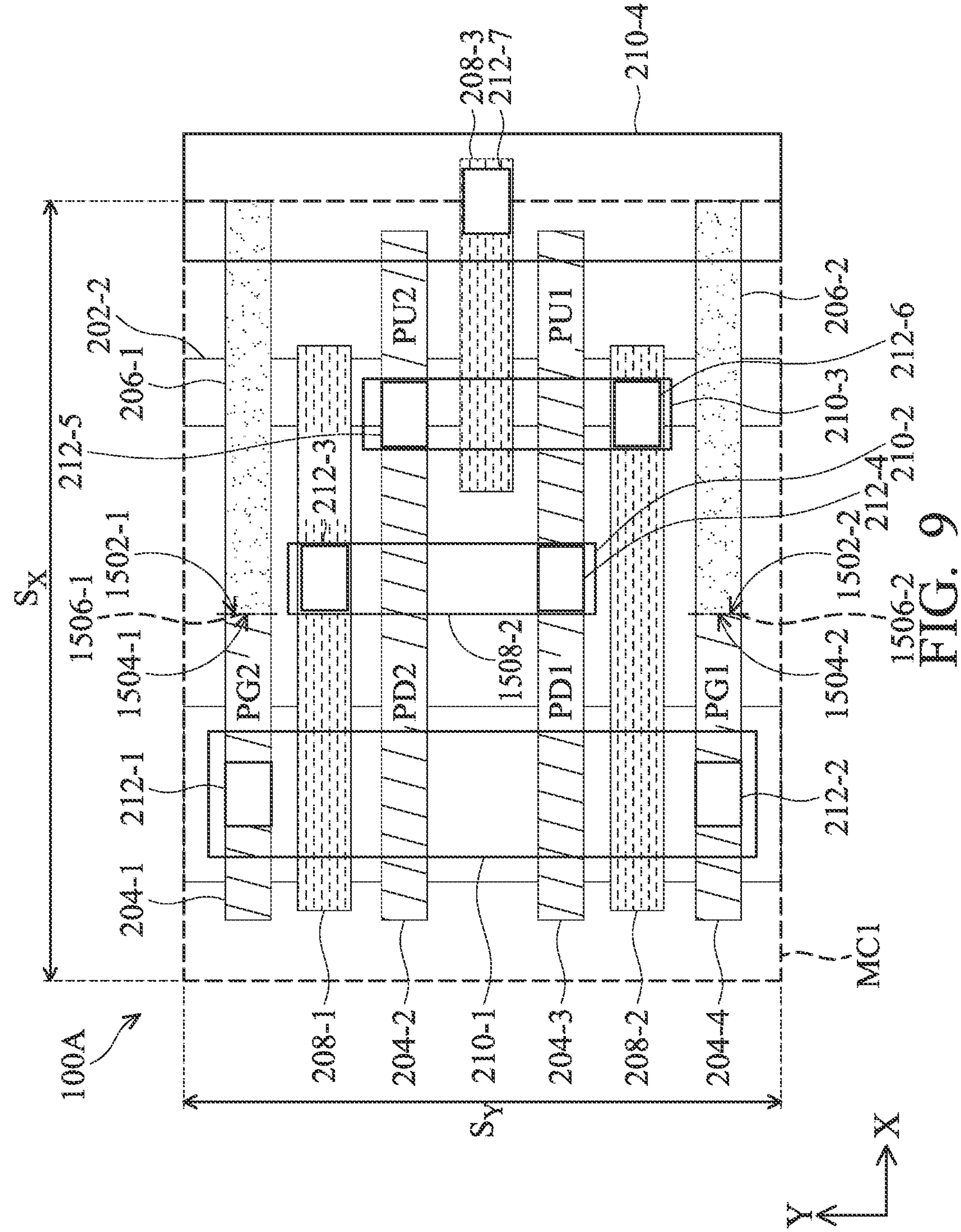

FIGS. 8 and 9 show layouts (or top views) of the SRAM cell 100A of the memory device in the memory region 20 of FIG. 1, in accordance with some alternative embodiments. The layouts in these embodiments are similar to the one shown in FIG. 4. As shown in FIG. 8, the dielectric structures 206-1 is in contact with the gate structures 204-1 and the dielectric structures 206-1 is in contact with the gate structures 204-1, similar to FIG. 4. Differences among them are contact interfaces between the gate structures 204 and the dielectric structures 206. Specifically, an edge 1504-1 of the gate structure 204-1 facing the dielectric structures 206-1 is in contact with an edge 1502-1 of the dielectric structures 206-1 facing the gate structure 204-1 to form a contact interface 1506-1 between the gate structure 204-1 and the dielectric structures 206-1. Similarly, an edge 1504-2 of the gate structure 204-4 facing the dielectric structures 206-2 is in contact with an edge 1502-2 of the dielectric structures 206-2 facing the gate structure 204-4 to form a contact interface 1506-2 between the gate structure 204-4 and the dielectric structures 206-2. In some embodiments, the contact interfaces 1506-1 and 1506-2, the edge 1504-1 of the gate structure 204-1, the edge 1502-1 of the dielectric structures 206-1, the edge 1504-2 of the gate structure 204-4, and the edge 1502-2 of the dielectric structures 206-2 are aligned with an edge 1508-1 of the metal line 210-2 facing the active area 202-2 in the top view, as shown in FIG. 8. In other embodiments, the contact interfaces 1506-1 and 1506-2, the edge 1504-1 of the gate structure 204-1, the edge 1502-1 of the dielectric structures 206-1, the edge 1504-2 of the gate structure 204-4, and the edge 1502-2 of the dielectric structures 206-2 are aligned with an edge 1508-8 of the metal line 210-2 facing the active area 202-1 in the top view, as shown in FIG. 9.

Figure 10:
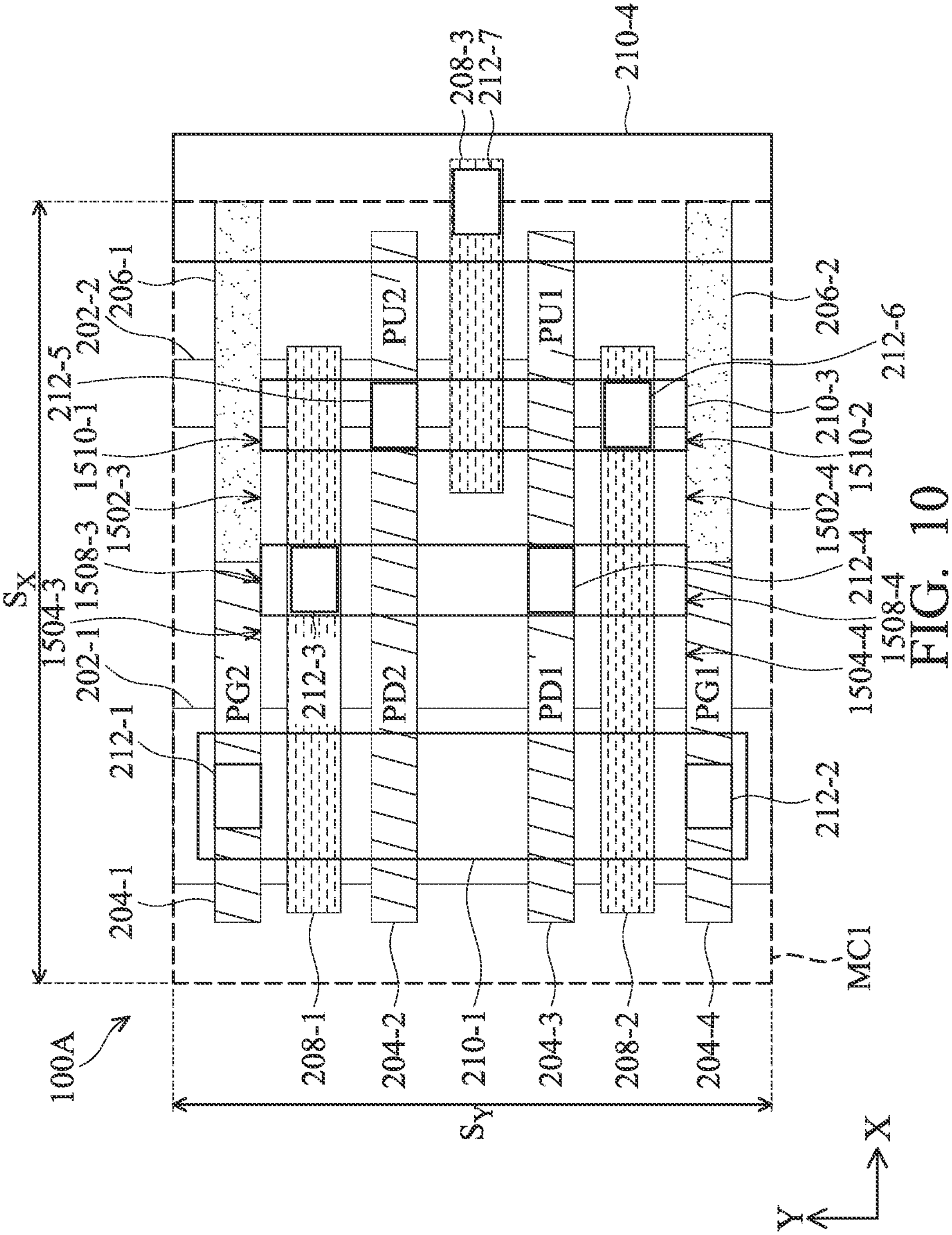
FIGS. 10 and 11 show layouts of an SRAM cell of a memory device in the memory region of FIG. 1, in accordance with some alternative embodiments.
Figure 11:
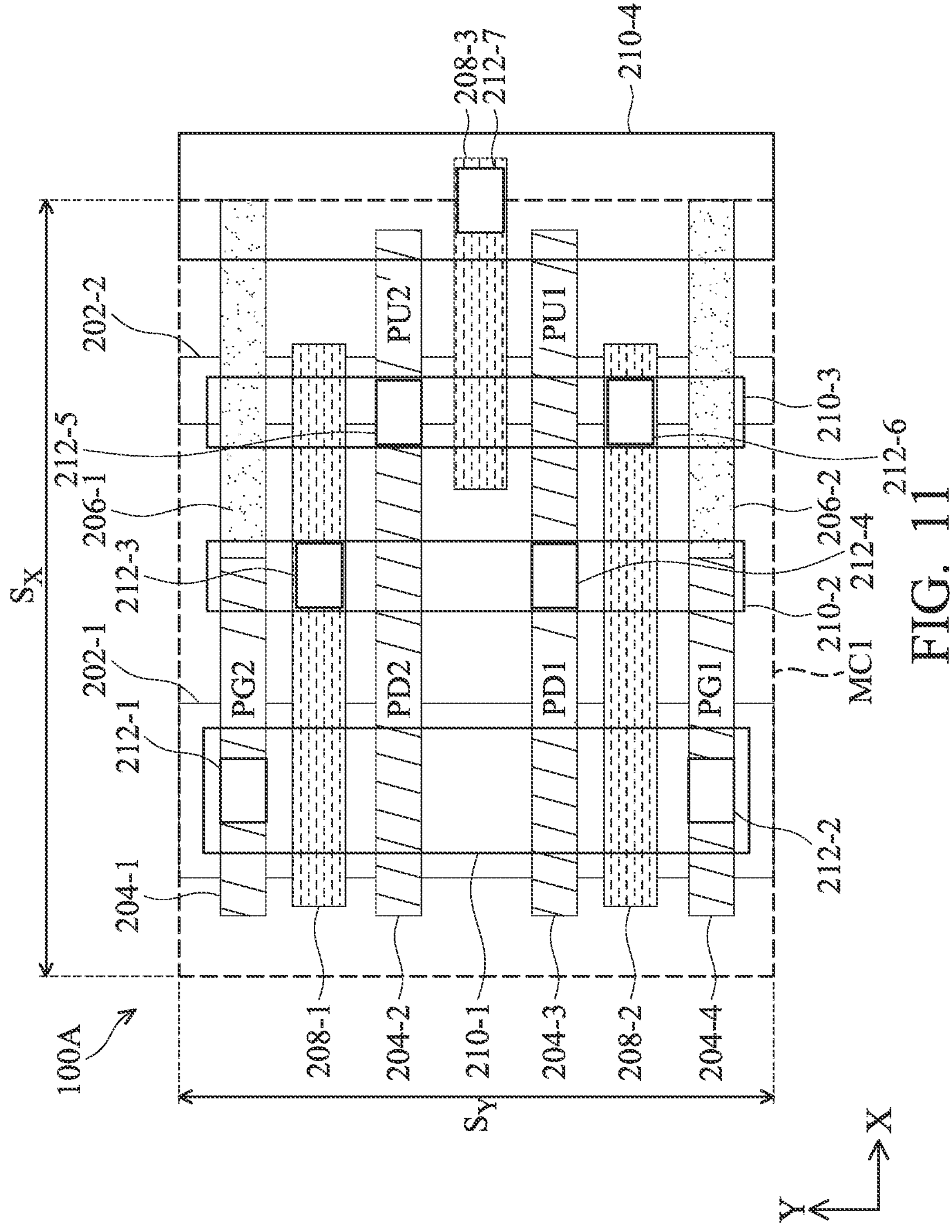

FIGS. 10 and 11 show layouts (or top views) of the SRAM cell 100A of the memory device in the memory region 20 of FIG. 1, in accordance with some alternative embodiments. The layouts in these embodiments are similar to the one shown in FIG. 4. Differences among them is a dimension of the metal lines 210-2 and 210-3. Referring to FIG. 10, the metal lines 210-2 and 210-3 extend in the first direction across two gate structures 204-2 and 204-3 and two source/drain contacts 208-1 and 208-2 in the top view. Further, an edge 1508-3 of the metal line 210-2 (which faces the pass-gate transistor PG2 and the dielectric structure 206-1) and an edge 1510-1 of the metal line 210-3 (which faces the dielectric structure 206-1) are aligned with an edge 1504-3 of the gate structure 204-1 and an edge 1502-3 of the dielectric structure 206-1 (which face the gate structure 204-2), as shown in FIG. 10. Additionally, an edge 1508-4 of the metal line 210-2 (which faces the pass-gate transistor PG2 and the dielectric structure 206-2) and an edge 1510-2 of the metal line 210-3 (which faces the dielectric structure 206-2) are aligned with an edge 1504-4 of the gate structure 204-4 and an edge 1502-4 of the dielectric structure 206-2 (which face the gate structure 204-3), as shown in FIG. 10. Referring to FIG. 11, the metal lines 210-2 and 210-3 extend in the first direction across all four gate structures 204-1 to 204-4 and two source/drain contacts 208-1 and 208-2 in the top view.

Figure 12:
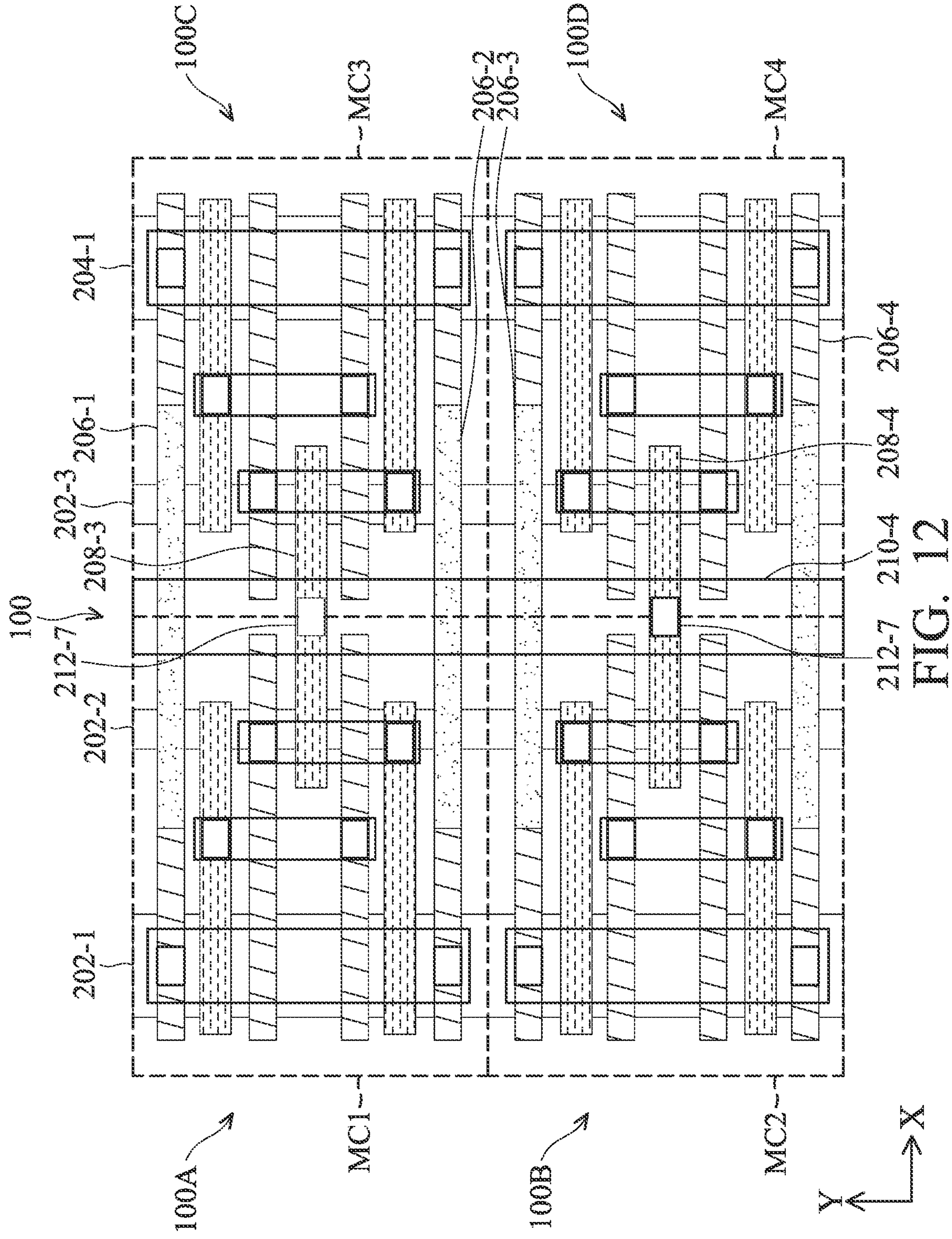
FIG. 12 is fragmentary diagrammatic top view of a memory array that can be incorporated into the memory region of FIG. 1, in accordance with some embodiments.

FIG. 12 is fragmentary diagrammatic top view of a memory array, such as an SRAM array 100 that can be incorporated into the memory region 20 of FIG. 1, in accordance with some embodiments. In FIG. 12, the SRAM array 100 includes the SRAM cell 100A having the cell boundary MC1 as discussed above, an SRAM cell 110B having a cell boundary MC2, an SRAM cell 110C having a cell boundary MC3, and an SRAM cell 110D having a cell boundary MC4. The SRAM cells 100A to 100D are arranged in a two-by-two array (or grid), where the layout of the SRAM cell is repeated in the SRAM array 100, such that the SRAM cells 100A to 100D exhibit mirror symmetry and/or rotational symmetry with respect to each other. For example, using the SRAM cell 100A as a reference, a layout of the SRAM cell 100B is a mirror image of the layout of the SRAM cell 100A with respect to an axis along the second direction (i.e., X-axis), a layout of the SRAM cell 100C is a mirror image of the layout of the SRAM cell 100A with respect to an axis along the first direction (i.e., Y-axis), and the layout of the SRAM cell 100D is a mirror image of the layout of the SRAM cell 100B with respect to the axis along the first direction. Put another way, the layout of the SRAM cell 100D is symmetric to the layout of the SRAM cell 100A by a rotation of 180 degrees about a geometric center of the grid, which can generally refer to an intersection point of an imaginary reference line bisecting the grid (array) along the Y-axis and an imaginary reference line bisecting the grid along the X-axis.

As shown in FIG. 12, adjacent two SRAM cell in the second direction (or in the same row) share the same dielectric structure. For example, the SRAM cell 100A and the SRAM cell 100C share the dielectric structures 206-1 and 206-2, and the SRAM cell 100B and the SRAM cell 100D share the dielectric structures 206-3 and 206-4. In other words, the dielectric structures may extend continuously from one SRAM cell to another SRAM cell, such as the dielectric structures 206-1 and 206-2 discussed above extend continuously from the SRAM cell 100A to the SRAM cell 100C in the second direction. In some embodiments, the dielectric structures 206-1 to 206-4 each has a dimension in the second direction in a range from about 80 nm to about 120 nm.

Further, the SRAM cell 100A and the SRAM cell 100C share the source/drain contact 208-3, and the SRAM cell 100B and the SRAM cell 100D share the source/drain contact 208-4. In some embodiments, the source/drain contact 208-3 and the source/drain contact 208-4 are connected to metal line 210-4 through vias 212-7 and 212-8, respectively. Therefore, the metal line 210-4 are share by the SRAM cells 100A to 100D to serves as voltage node $V_{DD}$ of the SRAM cell cells 100A to 100D to supply voltage to the pull-up transistors PU1 and PU2 in the SRAM cell cells 100A to 100D.

As shown in FIG. 12, adjacent two SRAM cell in the first direction (or in the same column) share the same active areas. For example, the SRAM cell 100A and the SRAM cell 100B share the active areas 202-1 and 202-2, and the SRAM cell 100C and the SRAM cell 100D share the active areas 202-3 and 202-4. In other words, the active areas may extend continuously from one SRAM cell to another SRAM cell in the same column, such as the active areas 202-1 and 202-2 discussed above extend continuously from the SRAM cell 100A to the SRAM cell 100B in the first direction. This means that the active areas is not cut into segments for each SRAM cell, as discussed above.

The embodiments disclosed herein relate to memory devices and their manufacturing methods, and more particularly to memory devices comprising a SRAM cell having dielectric structure for turning off the dummy transistors or making the dummy transistors fail. Although not intended to be limiting, embodiments of the present disclosure provide one or more of the following advantages. For example, with the four-poly-pitch SRAM cell layout and with the metal lines used for BL, BLB, and $V_{SS}$ implemented on the backside, SRAM cells of present embodiment have reduced resistance and capacitance. The present disclosure also enables more lithography friendly and cost reduction layout (no EUV processes and extra mask) for the active areas. Embodiments of the present disclosure can be readily integrated into existing semiconductor manufacturing processes.

Thus, one of the embodiments of the present disclosure describes a memory device that includes a first pull-down (PD) transistor, a second PD transistor, a first pass-gate (PG) transistor, and a second PG transistor that are arranged in a first direction and that share a first active area. In some embodiments, the memory device further includes a first pull-up (PU) transistor, a second PU transistor, a first dielectric structure, and a second dielectric structure that are arranged in the first direction and that share a second active area. The first PU transistor and the first PD transistor share a first gate structure that extends in a second direction. The second direction is perpendicular to the first direction. The second PU transistor and the second PD transistor share a second gate structure that extends in the second direction. The first dielectric structure and a third gate structure of the first PG transistor extend in the second direction and are aligned with each other in the second direction. The second dielectric structure and a fourth gate structure of the second PG transistor extend in the second direction and are aligned with each other in the second direction.

In some embodiments, the first dielectric structure is in contact with the third gate structure and the second dielectric structure is in contact with the fourth gate structure.

In some embodiments, the first dielectric structure is separated from the third gate structure in the second direction and the second dielectric structure is separated from the fourth gate structure in the second direction.

In some embodiments, the memory device further includes a node conductor extending in the first direction and between the active area and the second active area in a top view. The node conductor is electrically coupled to a source/drain feature between the second PU transistor and the second dielectric structure.

In some embodiments, an edge of the first dielectric structure is aligned with an edge of the node conductor facing the second active area in the top view.

In some embodiments, an edge of the first dielectric structure is aligned with an edge of the node conductor facing the first active area in the top view.

In some embodiments, an edge of the node conductor facing the second PG transistor is aligned with an edge of the second dielectric structure.

In some embodiments, the node conductor is extended in the first direction across the first dielectric structure and the second dielectric structure in the top view.

In some embodiments, a first SRAM cell includes the first PD transistor, the second PD transistor, the first PG transistor, the second PG transistor, the first PU transistor, and the second PU transistor. The memory device further includes a second SRAM cell that is adjacent to and a mirror image of the first SRAM cell with respect to an axis along the first direction. The first dielectric structure and the second dielectric structure extend continuously from the first SRAM cell to the second SRAM cell.

In some embodiments, the first dielectric structure and the second dielectric structure each has a dimension in the second direction in a range from about 80 nm to about 120 nm.

In some embodiments, a first SRAM cell includes the first PD transistor, the second PD transistor, the first PG transistor, the second PG transistor, the first PU transistor, and the second PU transistor. The memory device further includes a second SRAM cell that is adjacent to and a mirror image of the first SRAM cell with respect to an axis along the second direction. The first active area and the second active area extend continuously from the first SRAM cell to the second SRAM cell.

In another of the embodiments, discussed is a memory device including a first active area and a second active area extending in a first direction and arranged in a second direction perpendicular to the first direction. In some embodiments, the memory device further includes a first gate structure, a second gate structure, a third gate structure, and a fourth gate structure extending in the second direction and arranged in the first direction. The first gate structure and the fourth gate structure are across the first active area in a top view, and the second gate structure and the third gate structure are across the first active area and the second active area in the top view. In some embodiments, the memory device further includes a first dielectric structure and a second dielectric structure across the second active area and extending in the second direction. The second gate structure and the third gate structure are between the first dielectric structure and the second dielectric structure in the first direction. The first dielectric structure is aligned with the first gate structure in the second direction and the second dielectric structure is aligned with the fourth gate structure in the second direction.

In some embodiments, the memory device further includes a power supply conductor extending in the first direction and over the first dielectric structure and the second dielectric structure. The power supply conductor is electrically coupled to a source/drain feature between the second gate structure and the third gate structure.

In some embodiments, the memory device further includes a node conductor extending in the first direction and between the active area and the second active area in the top view, and a contact interface between the first dielectric structure and the first gate structure. The node conductor is electrically coupled to the third gate structure.

In some embodiments, the contact interface is aligned with an edge of the node conductor facing the first active area in the top view.

In some embodiments, the contact interface is aligned with an edge of the node conductor facing the second active area in the top view.

In some embodiments, the first dielectric structure and the second dielectric structure each comprise $SiO_2$, $Si_3N_4$, SiON, SiOCN, SiOC, or SiCN.

In some embodiments, the first dielectric structure and the second dielectric structure each has a dimension in the second direction in a range from about 1 nm to about 7 nm.

In yet another of the embodiments, discussed is a method for manufacturing a memory device that includes forming a first stack and a second stack extending in a first direction and arranged in a second direction perpendicular to the first direction. The first stack and the second stack each has first semiconductor layers and second semiconductor layers alternately stacked in a third direction perpendicular to the first direction and the second direction. In some embodiments, the method further includes forming a first dummy gate structure, a second dummy gate structure, a third dummy gate structure, and a fourth dummy gate structure extending in the second direction, arranged in the first direction, and over the first stack and the second stack;

forming source/drain features in the first stack and the second stack; removing a portion of the first dummy gate structure and a portion of the fourth dummy gate structure over the second stack to form a first trench and a second trench; removing the first semiconductor layers and the second semiconductor layers in the first trench and the second trench; forming dielectric structures in the first trench and the second trench; removing a remaining portion of the first dummy gate structure, the second dummy gate structure, the third dummy gate structure, a remaining portion of the fourth dummy gate structure, and the first semiconductor layers in the first stack and the second stack to form gate trenches; and forming gate structures in the gate trenches.

In some embodiments, the dielectric structures have a dimension in the first direction in a range from about 1 nm to about 7 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:

a first pull-down (PD) transistor, a second PD transistor, a first pass-gate (PG) transistor, and a second PG transistor arranged in a first direction and sharing a first active area protruding from a material layer; and a first pull-up (PU) transistor, a second PU transistor, a first dielectric structure, and a second dielectric structure arranged in the first direction and sharing a second active area protruding from the material layer, wherein:

the first PU transistor and the first PD transistor share a first gate structure extending in a second direction perpendicular to the first direction;

the second PU transistor and the second PD transistor share a second gate structure extending in the second direction;

the first dielectric structure and a third gate structure of the first PG transistor extend in the second direction and are aligned with each other in the second direction; and the second dielectric structure and a fourth gate structure of the second PG transistor extend in the second direction and are aligned with each other in the second direction, wherein the first dielectric structure is separated from the first gate structure and the second gate structure, wherein in a cross-sectional view, a top surface of the first dielectric structure is substantially level with top surfaces of the first gate structure and the second gate structure.

2. The memory device of claim 1, wherein the first dielectric structure is in contact with the third gate structure and the second dielectric structure is in contact with the fourth gate structure.

3. The memory device of claim 1, wherein the first dielectric structure is separated from the third gate structure in the second direction and the second dielectric structure is separated from the fourth gate structure in the second direction.

4. The memory device of claim 1, further comprising:

a node conductor extending in the first direction and between the first active area and the second active area in a top view, wherein the node conductor is electrically coupled to a source/drain feature between the second PU transistor and the second dielectric structure.

5. The memory device of claim 4, wherein an edge of the first dielectric structure is aligned with an edge of the node conductor facing the second active area in the top view.

6. The memory device of claim 4, wherein an edge of the first dielectric structure is aligned with an edge of the node conductor facing the first active area in the top view.

7. The memory device of claim 4, wherein an edge of the node conductor facing the second PG transistor is aligned with an edge of the second dielectric structure.

8. The memory device of claim 4, wherein the node conductor is extended in the first direction across the first dielectric structure and the second dielectric structure in the top view.

9. The memory device of claim 1, wherein:

a first SRAM cell comprises the first PD transistor, the second PD transistor, the first PG transistor, the second PG transistor, the first PU transistor, and the second PU transistor; and the memory device further comprises a second SRAM cell that is adjacent to and a mirror image of the first SRAM cell with respect to an axis along the first direction, wherein the first dielectric structure and the second dielectric structure extend continuously from the first SRAM cell to the second SRAM cell.

10. The memory device of claim 9, wherein the first dielectric structure and the second dielectric structure each has a dimension in the second direction in a range from about 80 nm to about 120 nm.

11. The memory device of claim 1, wherein:

a first SRAM cell comprises the first PD transistor, the second PD transistor, the first PG transistor, the second PG transistor, the first PU transistor, and the second PU transistor; and the memory device further comprises a second SRAM cell that is adjacent to and a mirror image of the first SRAM cell with respect to an axis along the second direction, wherein the first active area and the second active area extend continuously from the first SRAM cell to the second SRAM cell.

12. A memory device, comprising:

a first active area and a second active area extending in a first direction and arranged in a second direction perpendicular to the first direction, wherein each of the first active area and the second active area comprises channel layers and source/drain features;

a first gate structure, a second gate structure, a third gate structure, and a fourth gate structure extending in the second direction and arranged in the first direction, wherein the first gate structure and the fourth gate structure are across the first active area in a top view, and the second gate structure and the third gate structure are across the first active area and the second active area in the top view;

a first dielectric structure and a second dielectric structure across the second active area and extending in the second direction, wherein a top surface of the first dielectric structure and a top surface of the second dielectric structure are higher than top surfaces of the source/drain features; and a dielectric layer under the second active area, the first dielectric structure and the second dielectric structure, wherein the first dielectric structure and the second dielectric structure interface with the dielectric layer, wherein the second gate structure and the third gate structure are between the first dielectric structure and the second dielectric structure in the first direction, wherein the first dielectric structure is aligned with the first gate structure in the second direction and the second dielectric structure is aligned with the fourth gate structure in the second direction.

13. The memory device of claim 12, further comprising:

a power supply conductor extending in the first direction and over the first dielectric structure and the second dielectric structure, wherein the power supply conductor is electrically coupled to a source/drain feature between the second gate structure and the third gate structure.

14. The memory device of claim 12, further comprising:

a node conductor extending in the first direction and between the first active area and the second active area in the top view, wherein the node conductor is electrically coupled to the third gate structure; and a contact interface between the first dielectric structure and the first gate structure.

15. The memory device of claim 14, wherein the contact interface is aligned with an edge of the node conductor facing the first active area in the top view.

16. The memory device of claim 14, wherein the contact interface is aligned with an edge of the node conductor facing the second active area in the top view.

17. The memory device of claim 12, wherein the first dielectric structure and the second dielectric structure each comprise SiO2, Si3N4, SiON, SiOCN, SiOC, or SiCN.

18. The memory device of claim 12, wherein the first dielectric structure and the second dielectric structure each has a dimension in the second direction in a range from about 1 nm to about 7 nm.

19. A memory device, comprising:

a first NMOS transistor, a second NMOS transistor, a third NMOS transistor, and a fourth NMOS transistor arranged in a first direction and share a first active area, wherein the first active area comprises first channel layers, second channel layers, third channel layers, and fourth channel layers;

a first PMOS transistor, a second PMOS transistor, a first dielectric structure, and a second dielectric structure arranged in the first direction and sharing a second active area, wherein the first active area and the second active area arranged in a second direction perpendicular to the first direction, wherein the second active area comprises fifth channel layers and sixth channel layers, wherein the first active area is separated from the second active area in the second direction, wherein in a cross-sectional view, a top surface of the first dielectric structure is higher than topmost surfaces of the fifth channel layers and the sixth channel layers;

a first gate structure extending across the first active area and aligned with the first dielectric structure in the second direction;

a second gate structure extending across the first active area and the second active area in the second direction;

a third gate structure extending across the first active area and the second active area in the second direction; and a fourth gate structure extending across the first active area and aligned with the second dielectric structure in the second direction.

20. The memory device of claim 19, further comprising:

a power supply conductor extending in the second direction and under the second gate structure and the third gate structure, wherein the power supply conductor is electrically coupled to a source/drain feature between the second gate structure and the third gate structure.

* * * * *